United States Patent
Ohmori et al.

(10) Patent No.: US 12,491,582 B2
(45) Date of Patent: Dec. 9, 2025

(54) LASER PROCESSING DEVICE AND LASER LIGHT MONITORING METHOD

(71) Applicant: JSW Aktina System Co., Ltd., Yokohama (JP)

(72) Inventors: Kenichi Ohmori, Tokyo (JP);
Suk-Hwan Chung, Tokyo (JP);
Ryosuke Sato, Tokyo (JP); Yuzaburo Ota, Tokyo (JP)

(73) Assignee: JSW Aktina System Co., Ltd., Yokohama (JP)

( * ) Notice: Subject to any disclaimer, the term of this patent is extended or adjusted under 35 U.S.C. 154(b) by 941 days.

(21) Appl. No.: 17/642,411

(22) PCT Filed: Jun. 23, 2020

(86) PCT No.: PCT/JP2020/024661
§ 371 (c)(1),
(2) Date: Mar. 11, 2022

(87) PCT Pub. No.: WO2021/049127
PCT Pub. Date: Mar. 18, 2021

(65) Prior Publication Data
US 2022/0331910 A1 Oct. 20, 2022

(30) Foreign Application Priority Data
Sep. 12, 2019 (JP) .................. 2019-165811

(51) Int. Cl.
*B23K 26/70* (2014.01)
*B23K 26/00* (2014.01)
(Continued)

(52) U.S. Cl.
CPC ........ *B23K 26/705* (2015.10); *B23K 26/0006* (2013.01); *B23K 26/062* (2015.10);
(Continued)

(58) Field of Classification Search
CPC ............. B23K 26/032; B23K 26/0622; B23K 2103/56; B23K 2101/40; B23K 26/705;
(Continued)

(56) References Cited

U.S. PATENT DOCUMENTS 1,114,300 A * 10/1914 Simmons ............... A43D 93/00
12/32
6,341,042 B1 1/2002 Matsunaka et al.
(Continued)

FOREIGN PATENT DOCUMENTS

CN 109643647 A 4/2019
JP 11-283933 A 10/1999
(Continued)

OTHER PUBLICATIONS

Communication issued Nov. 4, 2024 in Chinese Application No. 202080064099.5.
(Continued)

*Primary Examiner* — Chris Q Liu
(74) *Attorney, Agent, or Firm* — Sughrue Mion, PLLC

(57) ABSTRACT

A laser processing device and a laser processing method that are capable of forming a high-quality semiconductor film are provided. An ELA device (excimer laser annealing device) (1) includes a laser oscillator (10) that generates laser light for forming a polysilicon film by irradiating an amorphous silicon film over a substrate to be processed with the laser light, a pulse measuring instrument (100) for detecting first partial light and second partial light contained in the laser light, and a monitoring device (60) for comparing a detection result of the first partial light with a detection result of the second partial light.

20 Claims, 25 Drawing Sheets

(51) Int. Cl.
*B23K 26/062* (2014.01)
*B23K 101/40* (2006.01)
*H01L 21/02* (2006.01)
*H01L 21/66* (2006.01)

(52) U.S. Cl.
CPC .... *B23K 2101/40* (2018.08); *H01L 21/02675* (2013.01); *H01L 22/20* (2013.01)

(58) Field of Classification Search
CPC .............. B23K 26/0006; B23K 26/083; B23K 31/125; B23K 26/03; B23K 26/0643; B23K 26/0648; B23K 26/0853; B23K 26/127; B23K 26/352; B23K 2103/52; B23K 26/00; B23K 26/062; B23K 26/0626; B23K 26/064; B23K 26/066; B23K 26/0665; B23K 26/067; B23K 26/0673; B23K 26/0676; B23K 26/0738; B23K 26/08; B23K 26/082; B23K 26/0821; B23K 26/354; B23K 26/53; B23K 26/704
USPC ............................. 219/121.6, 121.61, 121.66
See application file for complete search history.

(56) References Cited

U.S. PATENT DOCUMENTS

| | | | | |
|---|---|---|---|---|
| 7,405,141 | B2* | 7/2008 | Jyumonji | B23K 26/0853 |
| | | | | 438/166 |
| 7,881,350 | B2* | 2/2011 | Miyairi | B23K 26/08 |
| | | | | 372/24 |
| 8,351,317 | B2* | 1/2013 | Kim | B23K 26/0676 |
| | | | | 250/492.2 |
| 9,099,386 | B2* | 8/2015 | Kakuno | H01L 21/2636 |
| 9,257,288 | B2* | 2/2016 | Ivan | H01L 21/268 |
| 9,508,932 | B2* | 11/2016 | Jeon | C30B 35/00 |
| 9,905,427 | B2* | 2/2018 | Kido | B23K 26/0622 |
| 10,234,765 | B2* | 3/2019 | Bragin | G03F 7/70041 |
| 2005/0189542 | A1* | 9/2005 | Kudo | H01L 21/268 |
| | | | | 257/E21.134 |
| 2019/0267240 | A1* | 8/2019 | Ohmori | H01L 21/02691 |

FOREIGN PATENT DOCUMENTS

| | | |
|---|---|---|
| JP | 2001-156016 A | 6/2001 |
| JP | 2001-338892 A | 12/2001 |
| JP | 2003-258349 A | 9/2003 |
| JP | 2006-49606 A | 2/2006 |
| JP | 2012-028569 A | 2/2012 |
| JP | 5829575 B2 | 12/2015 |
| WO | 2004/040628 A1 | 5/2004 |

OTHER PUBLICATIONS

Office Action issued on Aug. 5, 2024 in Korean Application No. 10-2022-7011790.
Japanese Office Action dated Jan. 30, 2024 in Japanese Application No. 2019-165811.
International Search Report for PCT/JP2020/024661, dated Sep. 24, 2020.
Communication issued Apr. 1, 2025 in Korean Application No. 10-2022-7011790.

* cited by examiner

LASER PROCESSING DEVICE AND LASER LIGHT MONITORING METHOD

CROSS REFERENCE TO RELATED APPLICATIONS

This application is a National Stage of International Application No. PCT/JP2020/024661 filed Jun. 23, 2020, claiming priority based on Japanese Patent Application No. 2019-165811 filed Sep. 12, 2019, the contents of all of which are incorporated herein by reference.

TECHNICAL FIELD

The present invention relates to a laser processing device and a laser light monitoring method.

BACKGROUND ART

A laser annealing device is known, which irradiates an amorphous film formed on a silicon substrate, a glass substrate, or the like with laser light to crystallize the amorphous film and form a crystallized film. For example, Patent Literature 1 describes a related laser annealing device.

CITATION LIST

Patent Literature

Patent Literature 1: Japanese Patent No. 5829575

SUMMARY OF INVENTION

Technical Problem

In a laser processing device such as a laser annealing device, it is desirable that an object to be processed is irradiated with appropriate laser light to form a high-quality semiconductor film.

Other problems and novel features will become apparent from the description and accompanying drawings of the present specification.

Solution to Problem

According to an embodiment, a laser processing device includes a laser generation device configured to generate laser light to be applied to an object to be processed, a photodetection device configured to detect a first partial light and a second partial light contained in the laser light, and a monitoring unit configured to compare a detection result of the first partial light with a detection result of the second partial light.

According to an embodiment, a laser light monitoring method includes the steps of (A) generating laser light to be applied to an object to be processed, (B) detecting first partial light and second partial light contained in the laser light, and (C) comparing a detection result of the first partial light with a detection result of the second partial light.

Advantageous Effects of Invention

According to the foregoing embodiment, a high-quality semiconductor film can be formed.

DESCRIPTION OF EMBODIMENTS

Figure 1:
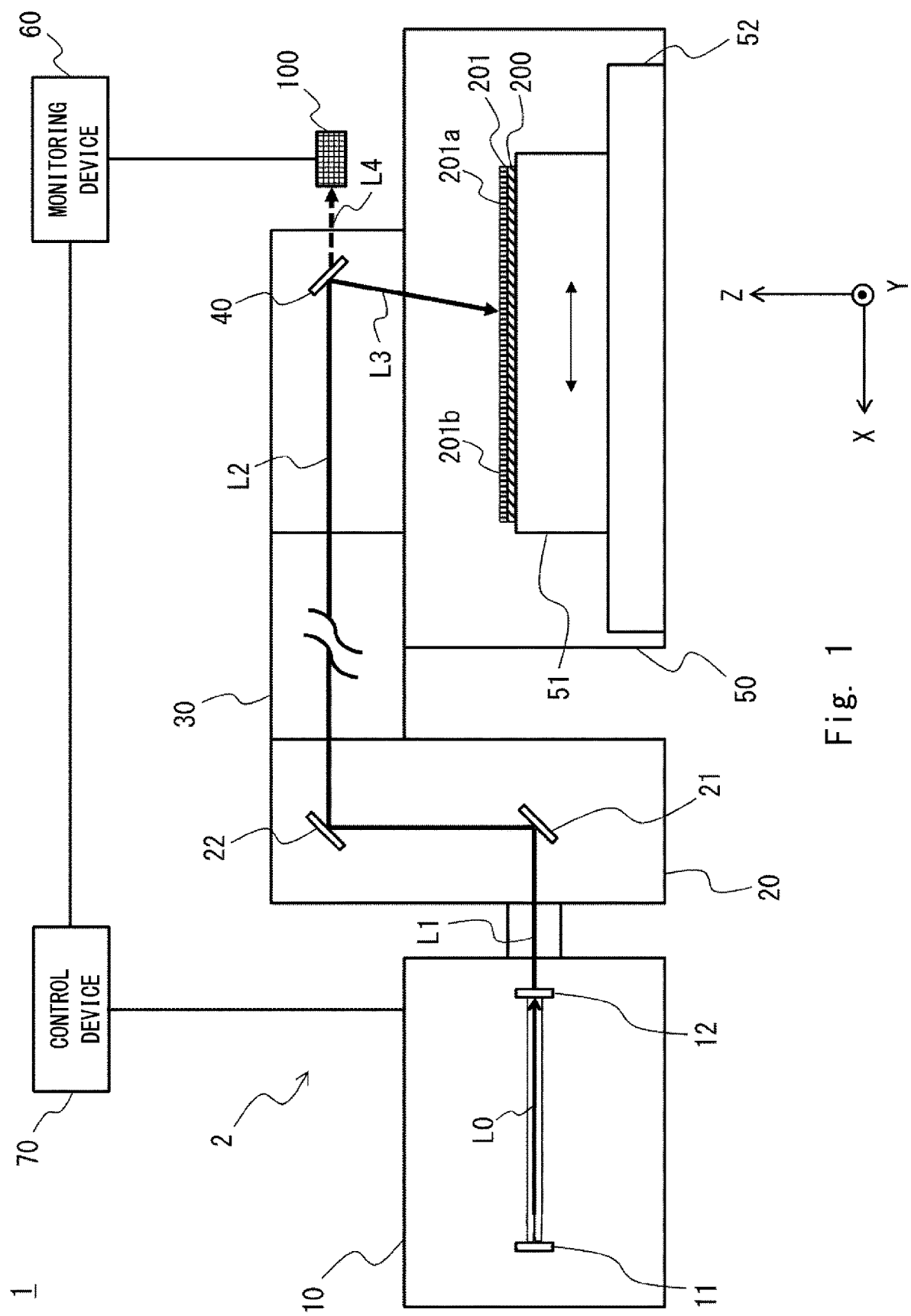
FIG. 1 is a diagram showing a configuration example of a laser annealing device according to a first embodiment.

Embodiments will be described hereinafter with reference to the drawings. The following descriptions and drawings are omitted or simplified as appropriate for the sake of clarity of explanation. Further, in the respective drawings, the same elements are designated by the same reference numerals, and duplicate descriptions thereon are omitted as necessary.

First Embodiment

First, a laser processing device and the laser light monitoring method according to a first embodiment will be described. The laser processing device according to the first embodiment is, for example, an excimer laser anneal (ELA) device for forming a low temperature poly-silicon (LTPS) film.

<Configuration of ELA Device>

A configuration of the ELA device 1 according to the present embodiment will be described with reference to FIG. 1. FIG. 1 is a diagram showing the configuration of the ELA device 1. The ELA device 1 irradiates a silicon film 201 formed over a substrate 200 with laser light L3. As a result, an amorphous silicon film (amorphous silicon film: a-Si film) 201 can be converted into a polycrystalline silicon film (polysilicon film: p-Si film) 201. The substrate 200 is a transparent substrate such as a glass substrate.

In an XYZ three-dimensional Cartesian coordinate system shown in FIG. 1, the Z direction is a vertical direction, and is a direction perpendicular to the substrate 200. The XY plane is a plane parallel to a plane on which the silicon film 201 of the substrate 200 is formed. For example, the X direction is a longitudinal direction of the rectangular substrate 200, and the Y direction is a lateral direction of the substrate 200. Note that when an Θ-axis stage that can rotate from 0° to 90° about the Z-axis is used, the X direction may be the lateral direction of the substrate 200, and the Y direction may be the longitudinal direction of the substrate 200.

Figure 2:
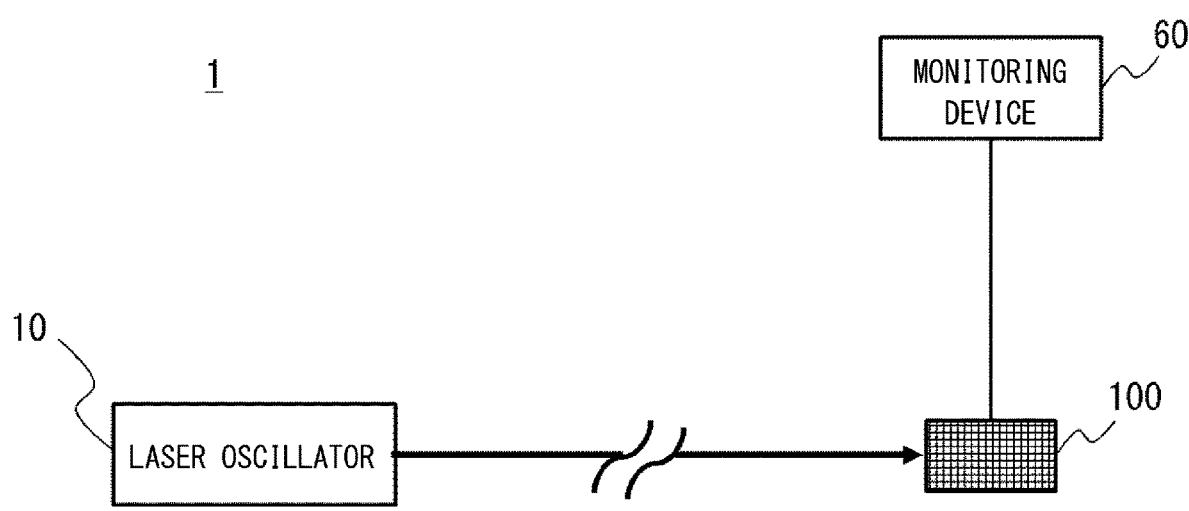
FIG. 2 is a diagram showing another configuration example of the laser annealing device according to the first embodiment.

As shown in FIG. 1, the ELA device 1 includes an annealing optical system 2, a laser irradiation chamber 50, a pulse measuring instrument 100, a monitoring device 60, and a control device 70. The configuration of FIG. 1 is an example, and in order to perform a monitoring method according to the present embodiment, the ELA device 1 may include at least the laser oscillator 10, the pulse measuring instrument 100, and the monitoring device 60 as shown in FIG. 2, for example.

The laser irradiation chamber 50 accommodates a base 52, and a stage 51 arranged over the base 52. In the ELA device 1, the silicon film 201 is irradiated with the laser light L3 while the substrate 200 is conveyed in the +X direction by the stage 51. In FIG. 1, with respect to the silicon film 201, the silicon film 201 before it is irradiated with the laser light L3 is referred to as an amorphous silicon film 201a, and the silicon film 201 after it is irradiated with the laser light L3 is referred to as a polysilicon film 201b.

The annealing optical system 2 is an optical system for generating laser light for crystallizing the amorphous silicon film 201a and irradiating the silicon film 201 with the laser light. Specifically, the annealing optical system 2 includes the laser oscillator 10, an input optical system 20, a beam shaper 30, and an epi-illumination mirror 40.

The laser oscillator 10 is a laser generation device for generating pulsed laser light as laser light to be applied to the amorphous silicon film 201a (an object to be processed). The laser light to be generated is laser light for crystallizing an amorphous film over a substrate to form a crystallized film, and is, for example, gas laser light. In the present embodiment, excimer laser light having a center wavelength of 308 nm is used as an example of the gas laser light. The gas laser light is not limited to the excimer laser, but may be other gas laser such as $CO_2$ laser. A gas such as chlorine is filled in the chamber of the laser oscillator 10, and two resonator mirrors 11 and 12 are arranged so as to face each other with the gas interposed therebetween. The resonator mirror 11 is a total reflection mirror for reflecting all light, and the resonator mirror 12 is a partial reflection mirror for transmitting a part of light therethrough. Gas light L0 excited by the gas repeatedly reflects between the resonator mirrors 11 and 12, and the amplified light is emitted from the resonator mirror 12 as laser light L1. For example, the laser oscillator 10 repeatedly emits the pulsed laser light L1 in a cycle of 500 Hz to 600 Hz. The laser oscillator 10 emits the laser light L1 to the input optical system 20.

The input optical system 20 propagates the laser light L1 generated by the laser oscillator 10 to the beam shaper 30. The input optical system 20 includes, for example, reflection mirrors 21 and 22. The reflection mirrors 21 and 22 may be a total reflection mirror or a partial reflection mirror. The laser light L1 incident from the laser oscillator 10 reflects in the order of the reflection mirror 21 and the reflection mirror 22, and then emitted to the beam shaper 30.

The beam shaper 30 shapes the laser light L1 incident via the input optical system 20 to generate laser light L2 having a beam-shape suitable for irradiating the silicon film 201. The beam shaper 30 generates a linear line beam along the Y direction, and further divides the line beam into a plurality of beams (partial light) in the Z direction. In other words, the laser light L2 includes a plurality of line beams arranged in the Z direction. The beam shaper 30 is an optical system for shaping the laser light L1 into a line beam, and is also an optical system for dividing the laser light L1 into a plurality of beams (divided beams). The generation of the plurality of line beams may be performed by generating a line beam from the laser light L1 and then dividing the line beam or dividing the laser light L1 and then generating the line beam from the divided light. For example, the beam shaper 30 expands the laser light L1 in the Y direction through a plurality of cylindrical lenses to be converted into a line beam. Further, the beam shaper 30 divides one beam into a plurality of beams, for example, by a homogenizer composed of a lens array. By dividing into a plurality of beams, the steepness width in the beam shape of the laser light to be irradiated can be made sharp. As an example, the laser light L1 is divided into 11 beams. The beam shaper 30 emits the generated laser light L2 to the epi-illumination mirror 40.

The epi-illumination mirror 40 is a rectangular reflection mirror extending in the Y direction, and reflects the laser light L2 which is a plurality of line beams generated by the beam shaper 30. The epi-illumination mirror 40 is, for example, a dichroic mirror, which is a partial reflection mirror for transmitting a part of light. In other words, the epi-illumination mirror 40 reflects the laser light L2 to generate the laser light L3, and at the same time, transmits a part of the laser light L2 therethrough to generate laser light L4. The epi-illumination mirror 40 irradiates the silicon film 201 over the substrate 200 with the laser light L3 as reflected light, and emits the laser light L4 as transmitted light to the pulse measuring instrument 100.

Figure 3:
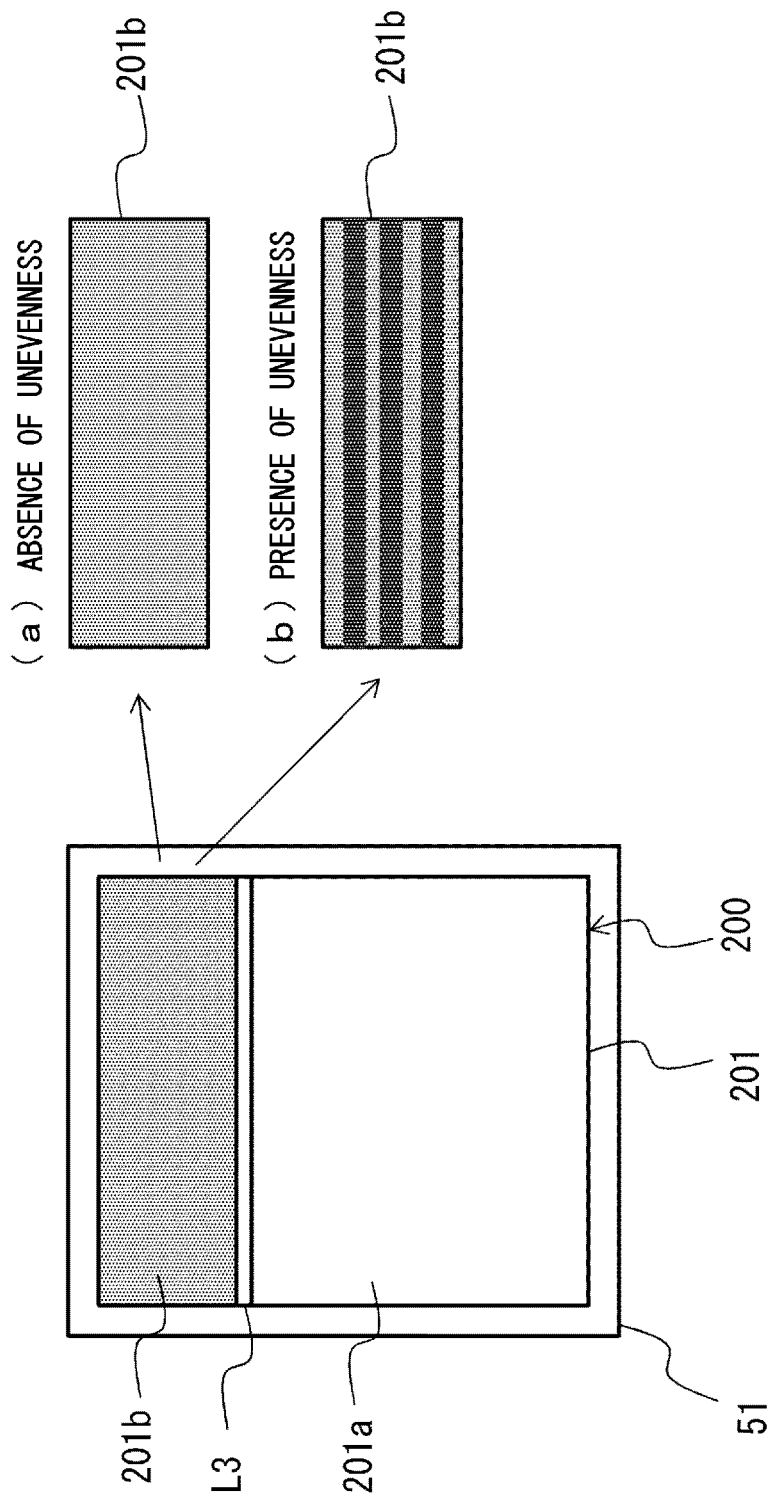
FIG. 3 is a diagram schematically showing a state of a crystallized film formed by the laser annealing device.

FIG. 3 schematically shows the silicon film 201 to be crystallized by irradiation of the laser light L3. The laser light L3 includes a plurality of line beams as described above, and forms a linear irradiation area in the Y direction over the substrate 200. In other words, the laser light L3 irradiated over the substrate 200 forms a linear irradiation area in which the Y direction is set as the longitudinal direction (major axis direction) and the X direction is set as the lateral direction (minor axis direction). Further, the silicon film 201 is irradiated with the laser light L3 while the substrate 200 is conveyed in the +X direction by the stage 51, whereby a band-shaped area whose width corresponds to the length of the irradiation area in the Y direction can be irradiated with the laser light L3. The amorphous silicon film 201a is crystallized by the irradiation of the laser light L3 described above. The silicon film 201 is irradiated with the laser light L3 while changing the irradiation position of the laser light L3 with respect to the substrate 200. The substrate 200 is conveyed in the +X direction by the stage 51, whereby the polysilicon film 201b is formed in order from an area irradiated with the laser light L3 over the substrate 200.

Here, the state of the thus-formed polysilicon film 201b has a great influence on the performance of the semiconductor device to be manufactured. Therefore, it is required that the crystalline state of the polysilicon film 201b is not uneven, that is, the variation in the crystal state is small and uniform as shown in FIG. 3(a). When the crystalline state of the polysilicon film 201b is uneven, that is, the variation in the crystal state is large and ununiform as shown in FIG. 3(b), the semiconductor device will be a defective product. An example of unevenness of the polysilicon film 201b may include a case where bright and dark stripes (called shot unevenness) are formed along the irradiation area of the line beam on the polysilicon film 201b. Such unevenness may be caused by variation in the spatial distribution of laser light, that is, variation in light in the cross section of the beam (called spatial variation). Therefore, in the present embodiment, by monitoring the spatial variation of the laser light, it is possible to suppress the occurrence of unevenness in the polysilicon film 201b to be formed.

Note that the solid-state laser has high coherence and is unlikely to cause spatial variation, whereas the gas laser has low coherence and is likely to cause spatial variation. Therefore, the present embodiment is suitable for the gas laser, particularly the excimer laser.

The pulse measuring instrument 100, the monitoring device 60, and the control device 70 in FIG. 1 are configurations for monitoring the spatial variation of the laser light and control the monitored spatial variation. The pulse measuring instrument 100 and the monitoring device 60 may be used as measuring units for measuring the pulse waveform of the laser light. Further, the monitoring device 60 and the control device 70 may be replaced by a processing device having both functions.

The pulse measuring instrument 100 is a measuring device (photodetection device) for measuring (detecting) the pulse waveform of the laser light to be applied to the substrate 200. In this example, the pulse measuring instrument 100 measures the laser light L4 transmitted from the epi-illumination mirror 40. The pulse measuring instrument 100 measures the intensities of a plurality of beams (for example, first partial light and second partial light) contained in the laser light L4, and outputs a measurement result to the monitoring device 60. Since it is only necessary to measure the spatial variation of the laser light to be applied to the substrate 200, the pulse measuring instrument 100 may measure the laser light at other points in the annealing optical system 2. For example, the laser light transmitted through the reflection mirror 21 or the reflection mirror 22 may be measured.

The monitoring device 60 and the control device 70 may be devices dedicated to the ELA device 1, or may be general-purpose computer devices such as a personal computer and a server computer. In such a device, each function of the monitoring device 60 and the control device 70 is implemented by executing a predetermined program stored in a storage unit by a processor such as a CPU (Central Processing Unit). Each of the monitoring device 60 and the control device 70 may be implemented by one device, or may be implemented by a plurality of devices on a network.

The monitoring device 60 is connected to the pulse measuring instrument 100 and the control device 70 so that various information and signals can be input and output therebetween. The monitoring device (monitoring unit) 60 monitors the spatial variation of the laser light (laser light L4 in this example) by comparing input measurement results of the pulse measuring instrument 100. The monitoring device 60 generates a pulse waveform of the laser light L4 from the intensity of the laser light L4 measured by the pulse measuring instrument 100. The monitoring device 60 generates pulse waveforms of a plurality of beams contained in the laser light L4, and calculates evaluation parameters for evaluating the pulse waveforms. The monitoring device 60 compares the pulse waveforms and evaluation parameters of the plurality of beams in the laser light L4, and determines the difference therebetween. The monitoring device 60 includes a display unit such as a display, and displays the pulse waveforms, intensities, and the like of the laser light L4 on the display unit. The monitoring device 60 determines the presence or absence of spatial variation in the laser light L4 based on the comparison result of the pulse waveforms, and outputs a determination result to the control device 70.

The control device (control unit) 70 is connected to the monitoring device 60 and the laser oscillator 10 so that various information and signals can be input and output therebetween. The control device 70 performs feedback control on the laser oscillator 10 based on the input determination result of the monitoring device 60. The control device 70 controls the generation condition for the laser light so as to suppress the spatial variation of the laser light. For example, the control device 70 adjusts the angle of the resonator mirror 12 by controlling a servomotor for driving the resonator mirror 12 in the laser oscillator 10, thereby controlling the intensity of the spatial distribution of the laser light L1. The control device 70 may automatically control the resonator mirror 12 according to the determination result of the monitoring device 60, or may control the resonator mirror 12 according to an operator's operation.

Figure 4A:
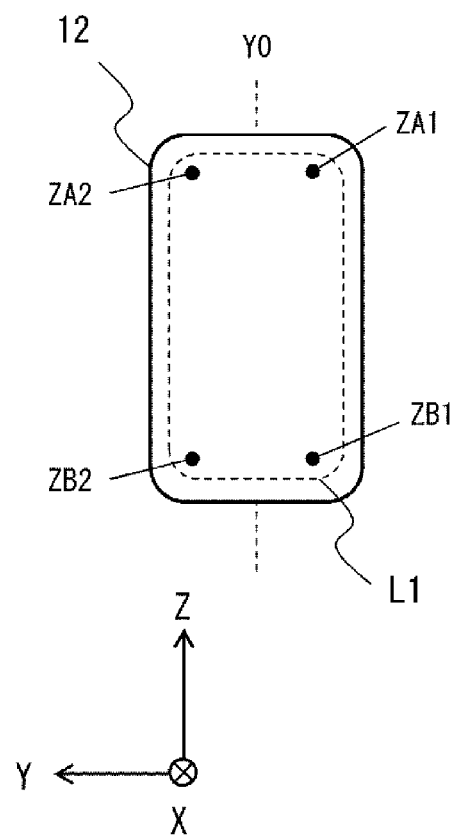
FIG. 4A is a diagram showing the relationship of laser light in the laser annealing device.
Figure 4B:
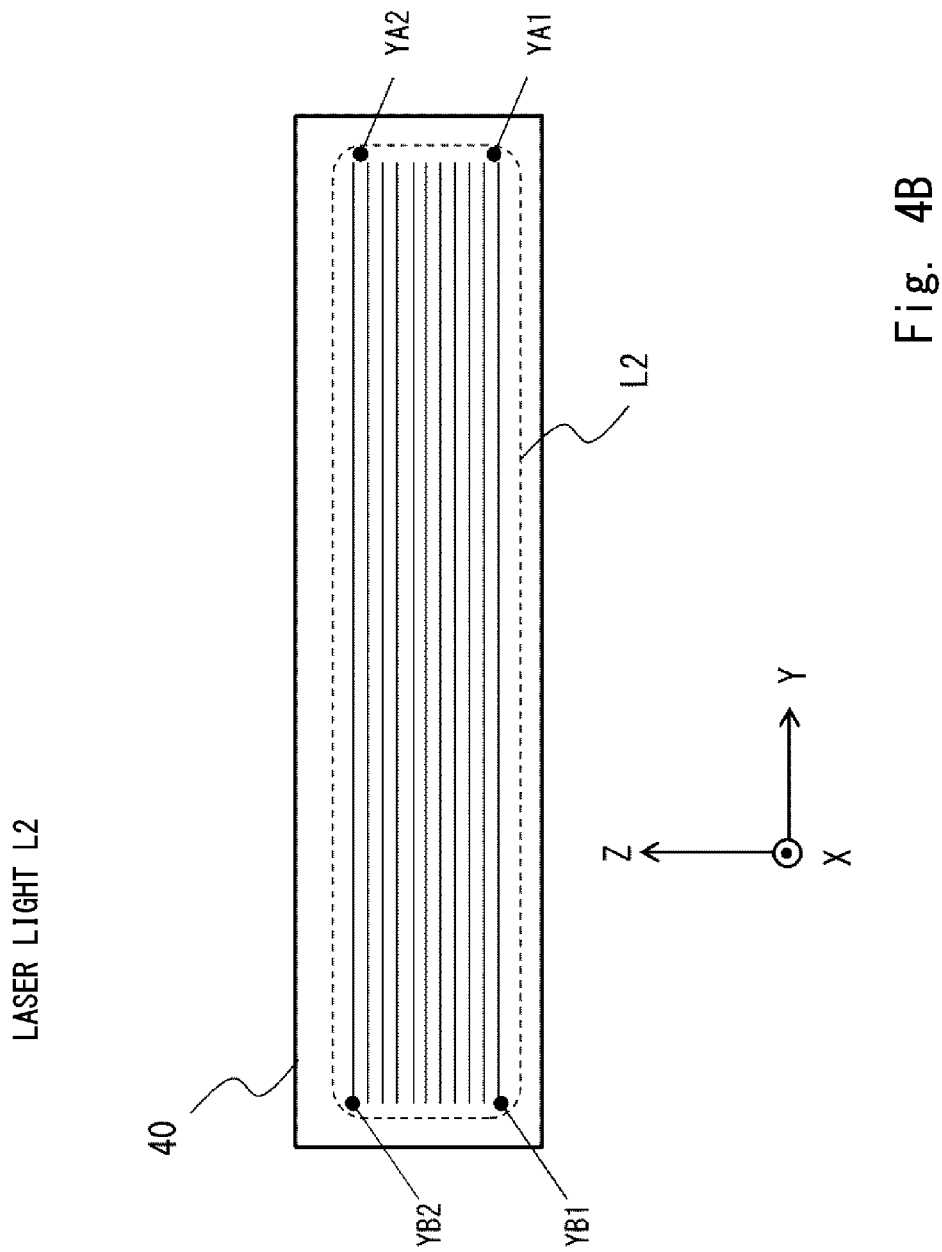
FIG. 4B is a diagram showing the relationship of laser light in the laser annealing device.

FIGS. 4A and 4B show the relationship in the spatial distribution (beam shape) between the laser light L1 emitted from the resonator mirror 12 of the laser oscillator 10 and the laser light L2 incident onto the epi-illumination mirror 40. As shown in FIG. 4A, the laser light L1 has a shape similar to that of the resonator mirror 12, that is, a substantially rectangular spatial distribution whose longitudinal direction corresponds to the Z direction. Further, as shown in FIG. 4B, the laser light L2 has a shape similar to that of the epi-illumination mirror 40, that is, a substantially rectangular spatial distribution whose longitudinal direction corresponds to the Y direction. In other words, the laser light L2 has a beam shape which rotates by 90° about the optical axis with respect to the laser beam L1. Light from a position ZA1 on the +Z side to a position ZB1 on the −Z side in the laser light L1 in FIG. 4A is combined to generate light (line beam) from a position YA1 on the +Y side to a position YB1 on the −Y side in the laser light L2 in FIG. 4B. Similarly, light from a position ZA2 to a position ZB2 in the laser light L1 of FIG. 4A is combined to generate light from a position YA2 to a position YB2 in the laser light L2 of FIG. 4B. The unevenness occurring in the polysilicon film 201b, that is, the shot unevenness along the Y direction is caused by the variation in the Z direction in the laser beam L2 as one factor. Therefore, in the present embodiment, the variation in the Z direction in the laser light L2 (L4 which is the transmitted light of L2) is monitored. Further, in order to adjust the intensity of the light in the Y direction of the laser light L1 which corresponds to the space in the Z direction of the laser light L2, the resonator mirror 12 is rotated around the center Y0 in the Y direction to control the angle thereof.

<Pulse Measuring Instrument of Comparative Example>

Figure 5:
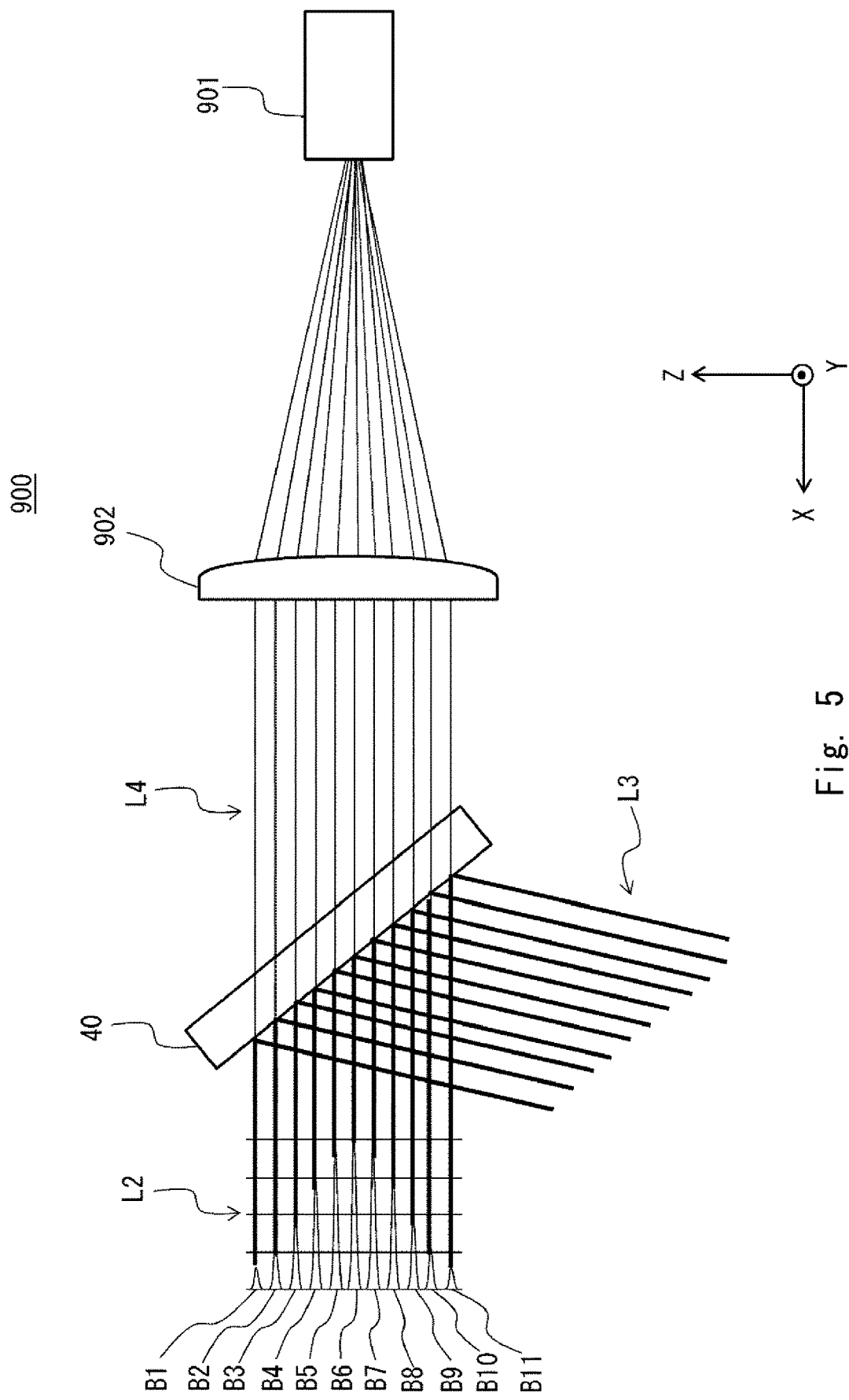
FIG. 5 is a side view showing a schematic configuration of a pulse measuring instrument of a comparative example.
Figure 6:
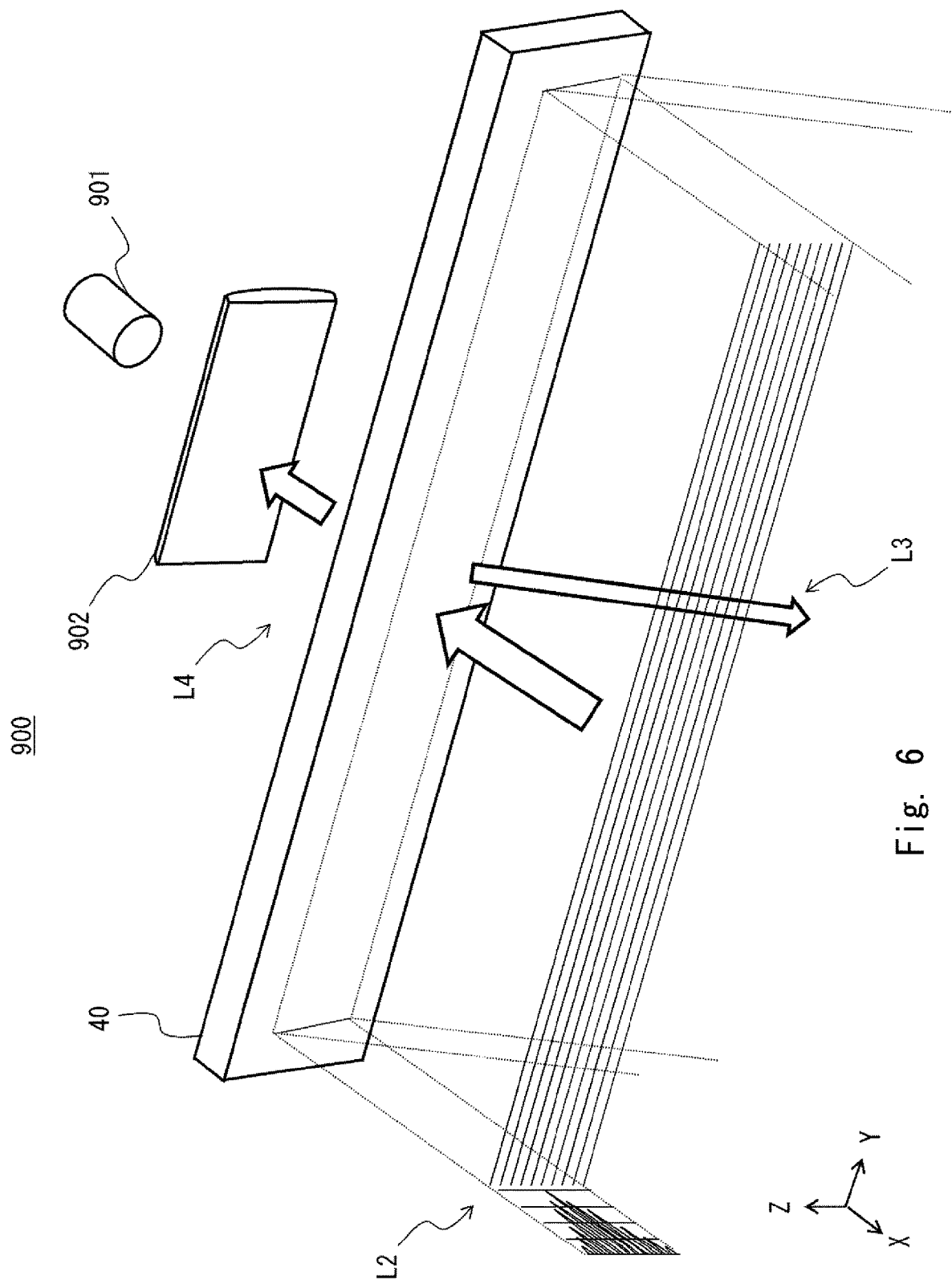
FIG. 6 is a perspective view showing the schematic configuration of the pulse measuring instrument of the comparative example.

Here, in order to deepen the understanding of the present embodiment, the configuration of a pulse measuring instrument 900 of a comparative example before the application of the present embodiment will be described with reference to FIG. 5 and FIG. 6. FIG. 5 is a side view showing a schematic configuration of the pulse measuring instrument 900, and FIG. 6 is a perspective view showing the schematic configuration of the pulse measuring instrument 900. As shown in FIG. 5 and FIG. 6, the pulse measuring instrument 900 includes a photodetector 901 and a condenser lens 902.

For example, the condenser lens 902 and the photodetector 901 are arranged in the vicinity of the center in the Y direction of the epi-illumination mirror 40. The condenser lens 902 converges the laser light L4 transmitted through the epi-illumination mirror 40 onto a light receiving portion of the photodetector 901. The photodetector 901 detects the intensity of the laser light L4 converged by the condenser lens 902.

As described above, in the pulse measuring instrument 900 of the comparative example, all the beams of the laser light L4 are collectively detected by one photodetector 901. In this example, the laser light L2 and the laser light L4 include beams B1 to B11, and the photodetector 901 detects all the beams B1 to B11 of the converged laser light L4. However, when the entire laser light is detected by one detector as in the pulse measuring instrument 900 of the comparative example, even if there are variations among beams, the variations are averaged, which makes it impossible to detect a spatial variation.

<Pulse Measuring Instrument of First Embodiment>

Figure 7:
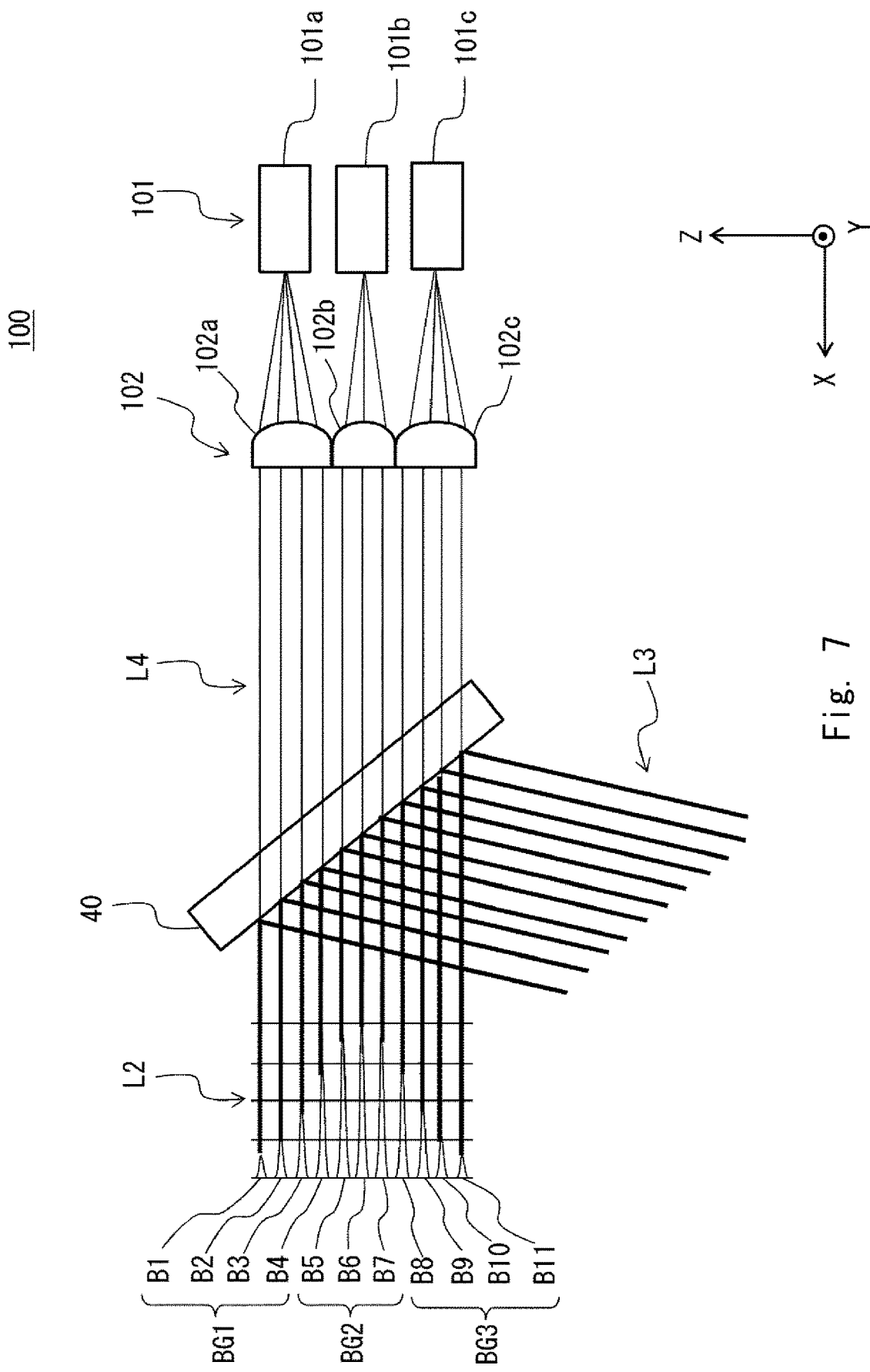
FIG. 7 is a side view showing a schematic configuration of a pulse measuring instrument according to the first embodiment.
Figure 8:
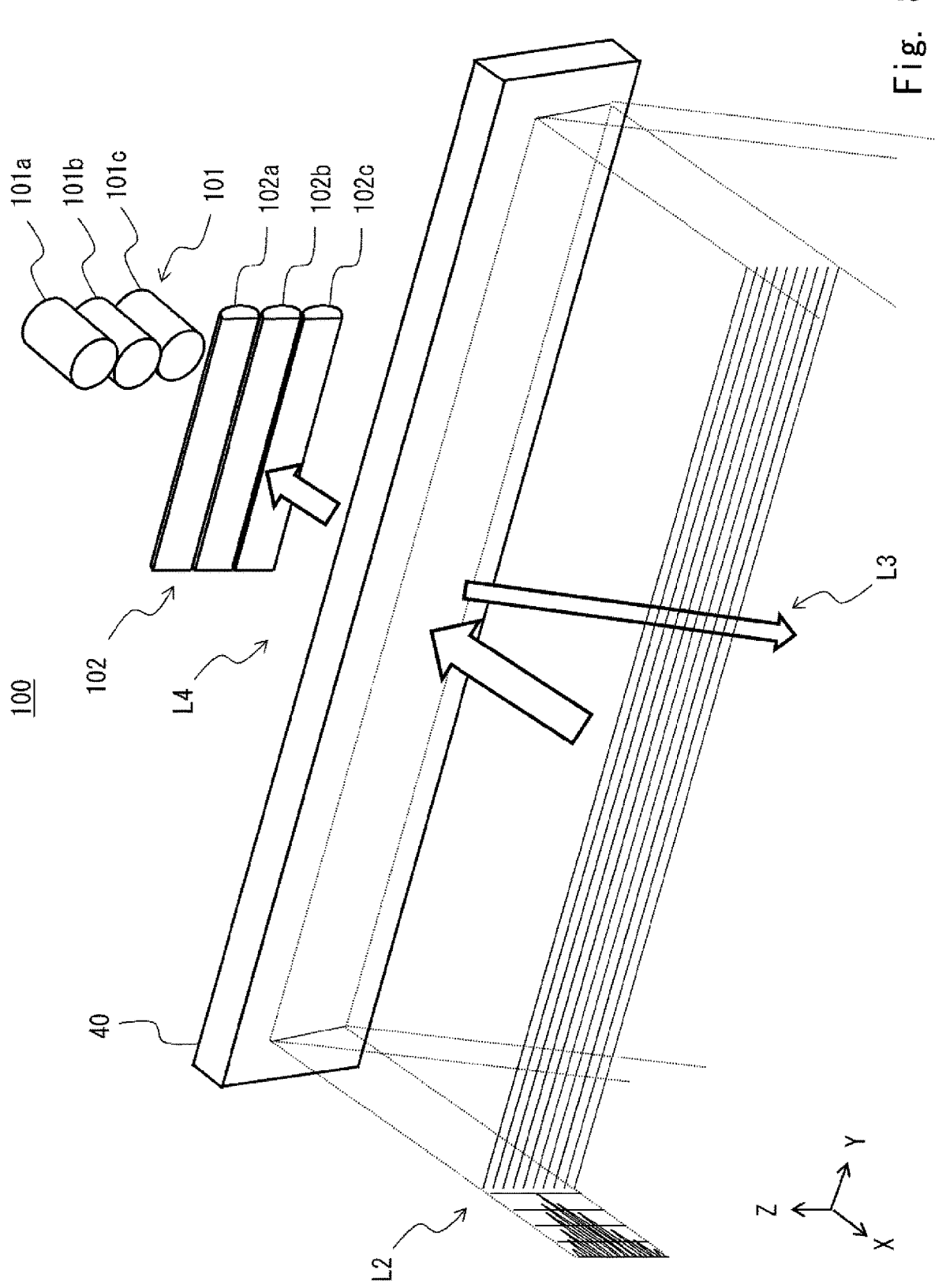
FIG. 8 is a perspective view showing the schematic configuration of the pulse measuring instrument according to the first embodiment.

The configuration of the pulse measuring instrument 100 according to the present embodiment will be described with reference to FIG. 7 and FIG. 8. FIG. 7 is a side view showing a schematic configuration of the pulse measuring instrument 100, and FIG. 8 is a perspective view showing the schematic configuration of the pulse measuring instrument 100. As shown in FIG. 7 and FIG. 8, the pulse measuring instrument 100 includes a plurality of photodetectors 101 and a plurality of condenser lenses 102. For example, the photodetector 101 is a biplanar tube or a photodiode, and the condenser lens 102 is a cylindrical lens.

In this example, three photodetectors, that is, a photodetector 101a (first photodetector), a photodetector 101b (second photodetector), and a photodetector 101c (third photodetector) are provided as the photodetectors 101, and three condenser lenses, that is, a condenser lens 102a (first condenser lens), a condenser lens 102b (second condenser lens), and a condenser lens 102c (third condenser lens) are provided as the condenser lenses 102. For example, the condenser lenses 102a to 102c and the photodetectors 101a to 101c are arranged in the vicinity of the center in the Y direction of the epi-illumination mirror 40, and are arranged in a row along the Z direction. Since the condenser lenses 102a to 102c and the photodetectors 101a to 101c are required only to be capable to detecting light at a plurality of locations in the Z direction, they may be arranged outside the center in the Y direction of the epi-illumination mirror 40, or may be arranged in the Z direction to be lined up diagonally.

The condenser lenses 102a to 102c converge respective beam groups of the laser light L4 transmitted through the epi-illumination mirror 40 onto the light receiving portions of the photodetectors 101a to 101c, respectively. The photodetectors 101a to 101c detect the intensities of the respective beam groups of the laser light L4 which have been converged by the condenser lenses 102a to 102c. The beams included in the beam group are converged by the condenser lens, so that it is possible to detect the beams on a beam group basis.

In this example, the beams B1 to B11 are grouped into three beam groups BG1 to BG3, and the four beams B1 to B4 on the upper side (+Z side) are grouped into the beam group BG1 (first beam group), the three beams B5 to B7 in the middle are grouped into the beam group BG2 (second beam group), and the four beams B8 to B11 on the lower side (−Z side) are grouped into the beam group BG3 (third beam group). The beams B1 to B4 of the beam group BG1 are converged by the condenser lens 102a, and the converged light is detected by the photodetector 101a. Similarly, the beams B5 to B7 of the beam group BG2 are converged by the condenser lens 102b, and the converged light is detected by the photodetector 101b. The beams B8 to B11 of the beam group BG3 are converged by the condenser lens 102c, and the converged light is detected by the photodetector 101c. A plurality of beam groups can be simultaneously detected by a plurality of photodetectors.

As described above, in the pulse measuring instrument 100 according to the present embodiment, the plurality of beams included in the laser light L4 are detected by the plurality of photodetectors 101a to 101c while grouping the beams. The intensity of the laser light L4 is detected every beam (group) included in the laser light L4, which makes it possible to reliably detect the spatial variation of the laser light L4. For example, the laser light L4 is detected for each of the three beam groups, which makes it possible to detect the spatial variation among the upper part, the center, and the lower part of the laser light L4. The number of beam groups to be detected is not limited to three, and may be any number of beam groups, and the number of beams included in each beam group may be arbitrarily set. Further, each beam (first beam to eleventh beam) may be detected individually without providing any beam group. By increasing the frequency of the detection using the photodetectors, the detection accuracy of spatial variation can be enhanced.

<Pulse Waveform Monitoring Method of First Embodiment>

Figure 9:
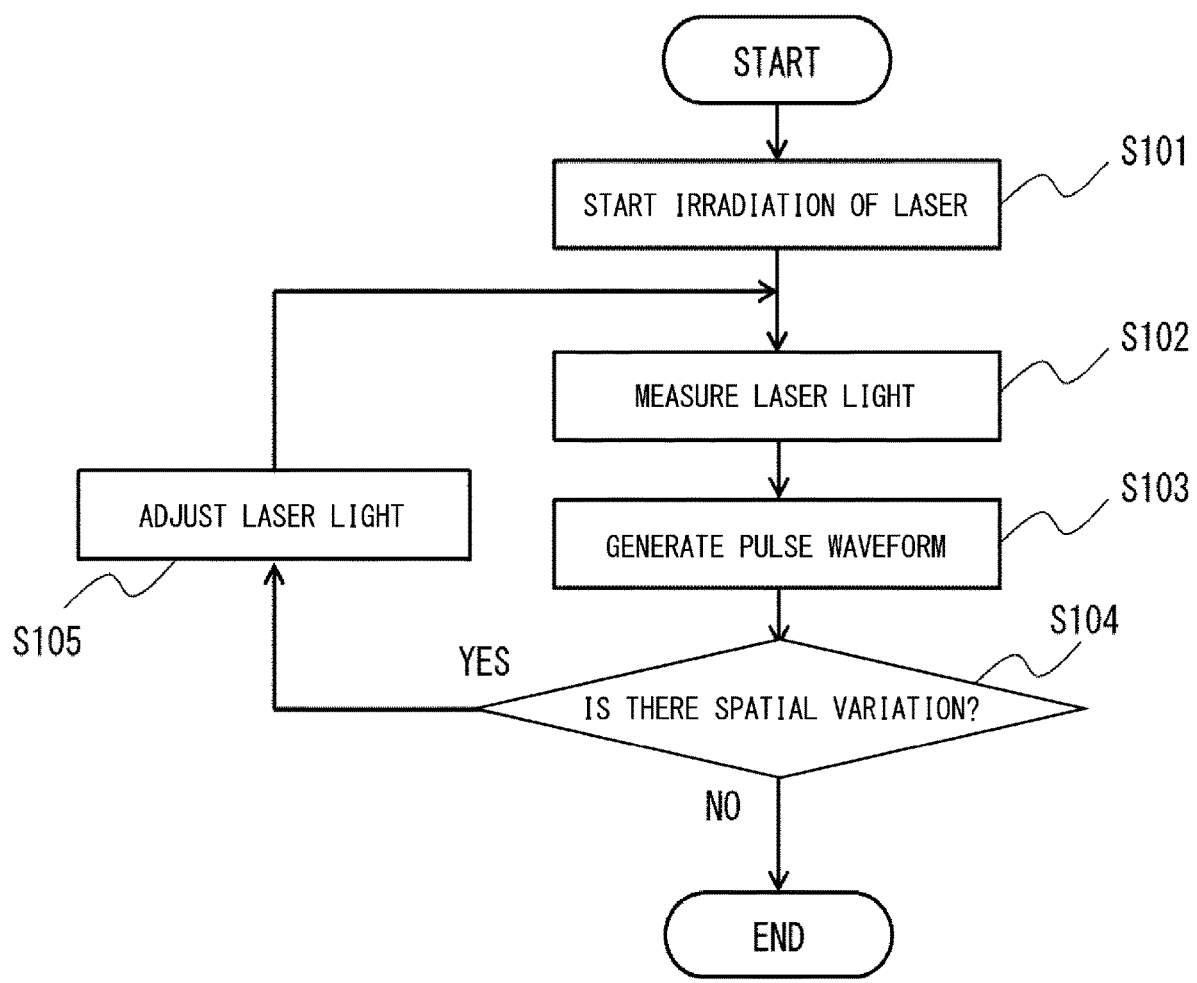
FIG. 9 is a flowchart showing a pulse waveform monitoring method according to the first embodiment.

A pulse waveform monitoring method performed by the ELA device 1 according to the present embodiment will be described with reference to FIG. 9. FIG. 9 is a flowchart showing the pulse waveform monitoring method according to the present embodiment. For example, this pulse waveform monitoring method is performed separately from the manufacturing process of a semiconductor device in the ELA device 1. The manufacturing process of a semiconductor device is repetitively performed for each set with a plurality of semiconductor devices being grouped as one set. The pulse waveform monitoring method according to the present embodiment is performed with the ELA device 1 being set to a measurement mode between the manufacturing process on the preceding set and the manufacturing process on the next set. As a result, it is possible to detect the spatial variation of the laser light before unevenness occurs on a semiconductor film in the manufacturing process of a semiconductor device, so that the occurrence of the unevenness on the semiconductor film can be suppressed in advance.

As shown in FIG. 9, the ELA device 1 first starts irradiation of laser light (S101). In other words, the control device 70 instructs the laser oscillator 10 to start oscillation in response to a user's operation. The laser oscillator 10 starts oscillating according to the instruction of the control device 70, and emits the laser light L1. The emitted laser light L1 is shaped into a plurality of line beams by the beam shaper 30 via the input optical system 20. The shaped laser light L2 is reflected by the epi-illumination mirror 40, and the reflected laser light L3 is irradiated over the substrate 200. Since this pulse waveform monitoring method is performed separately from the manufacturing process of a semiconductor device, the substrate 200 may not be placed over the stage 51.

Subsequently, the ELA device 1 measures the laser light which has been started to be irradiated (S102). In other words, the pulse measuring instrument 100 detects the intensity of the laser light L4 transmitted through the epi-illumination mirror 40. In the present embodiment, the photodetectors 101a to 101c in the pulse measuring instrument 100 group the beams B1 to B11 of the laser light L4 into three beam groups BG1 to BG3, detect the intensities of the respective beam groups, and output detection results to the monitoring device 60.

Subsequently, the ELA device 1 generates a pulse waveform of the measured laser light (S103). In other words, the monitoring device 60 acquires the intensities of the beam groups BG1 to BG3 from the pulse measuring instrument 100, and generates a pulse waveform for each of the beam groups BG1 to BG3 based on the acquired intensities. For example, the pulse width is set to 20 ns to 100 ns, and the pulse waveforms are generated in the cycle of the pulse width.

Figure 10:
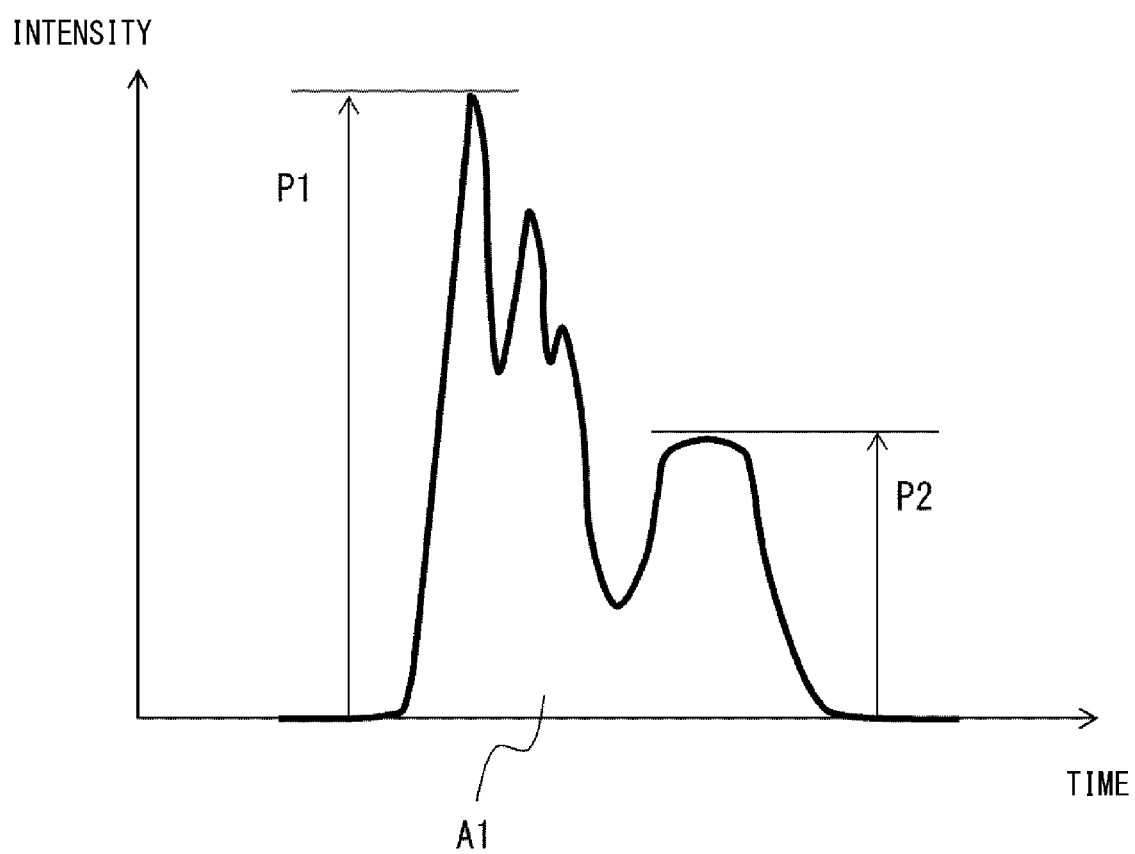
FIG. 10 is a diagram showing an example of a pulse waveform monitored by the pulse waveform monitoring method according to the first embodiment.

FIG. 10 shows an example of the generated pulse waveform. Since the laser light in the present embodiment is excimer laser light, the laser light has a waveform in which a first peak P1 and a second peak P2 appear consecutively, and the second peak has an intensity lower than that of the first peak P1 appearing first. The area A1 of the pulse waveform indicates the energy of the pulse.

The monitoring device 60 calculates the first peak P1, the second peak P2, and the area A1 (energy) as evaluation parameters of the pulse. Note that other evaluation parameters such as the pulse width and the rise time to the first peak P1 may be calculated. Further, the monitoring device 60 determines statistical values such as a variance value ($\sigma$), an average value, a minimum value, and a maximum value of evaluation parameters from a pulse waveform generated in a predetermined period.

Subsequently, the ELA device 1 determines the presence or absence of spatial variation in the pulse waveform (S104). In other words, the monitoring device 60 evaluates the spatial variation based on the pulse waveforms of the beam groups BG1 to BG3. The monitoring device 60 compares the pulse waveform of the beam group BG1, the pulse waveform of the beam group BG2, and the pulse waveform of the beam group BG3. For example, the monitoring device 60 determines differences in the variance value, the average value, the minimum value, the maximum value, and the like of the first peak P1, the second peak P2, and the area A1, which are the evaluation parameters of the pulse waveform. The differences in the evaluation parameters of the pulse waveform at a specific timing may be determined. By acquiring the differences in the variance value and the like based on a plurality of pulse waveforms, the variation can be evaluated accurately. For example, when the difference in the variance value of the evaluation parameters is larger than a predetermined threshold value, the monitoring device 60 determines that there is spatial variation, and when the difference is not larger than the predetermined threshold value, the monitoring device 60 determines that there is no spatial variation.

If it is determined in S104 that there is no spatial variation, the monitoring method is terminated, and the ELA device 1 performs the manufacturing process on the next set of semiconductor devices. On the other hand, when it is determined that there is spatial variation, the ELA device 1 adjusts the laser light (S105). In other words, when the monitoring device 60 determines that there is spatial variation, the control device 70 controls the angle of the resonator mirror 12 of the laser oscillator 10 to adjust the intensity of the spatial distribution of the laser light L1. The control device 70 changes the inclination of the resonator mirror 12 at a predetermined angle, and further measures the laser light in S102 to S103. The adjustment of the laser light is repeated until the differences in the evaluation values of the evaluation parameters are converged and it is determined that there is no spatial variation. The angle for adjusting the resonator mirror 12 may be changed according to the magnitude of the spatial variation or the like.

<Measurement Result>

Figure 11:
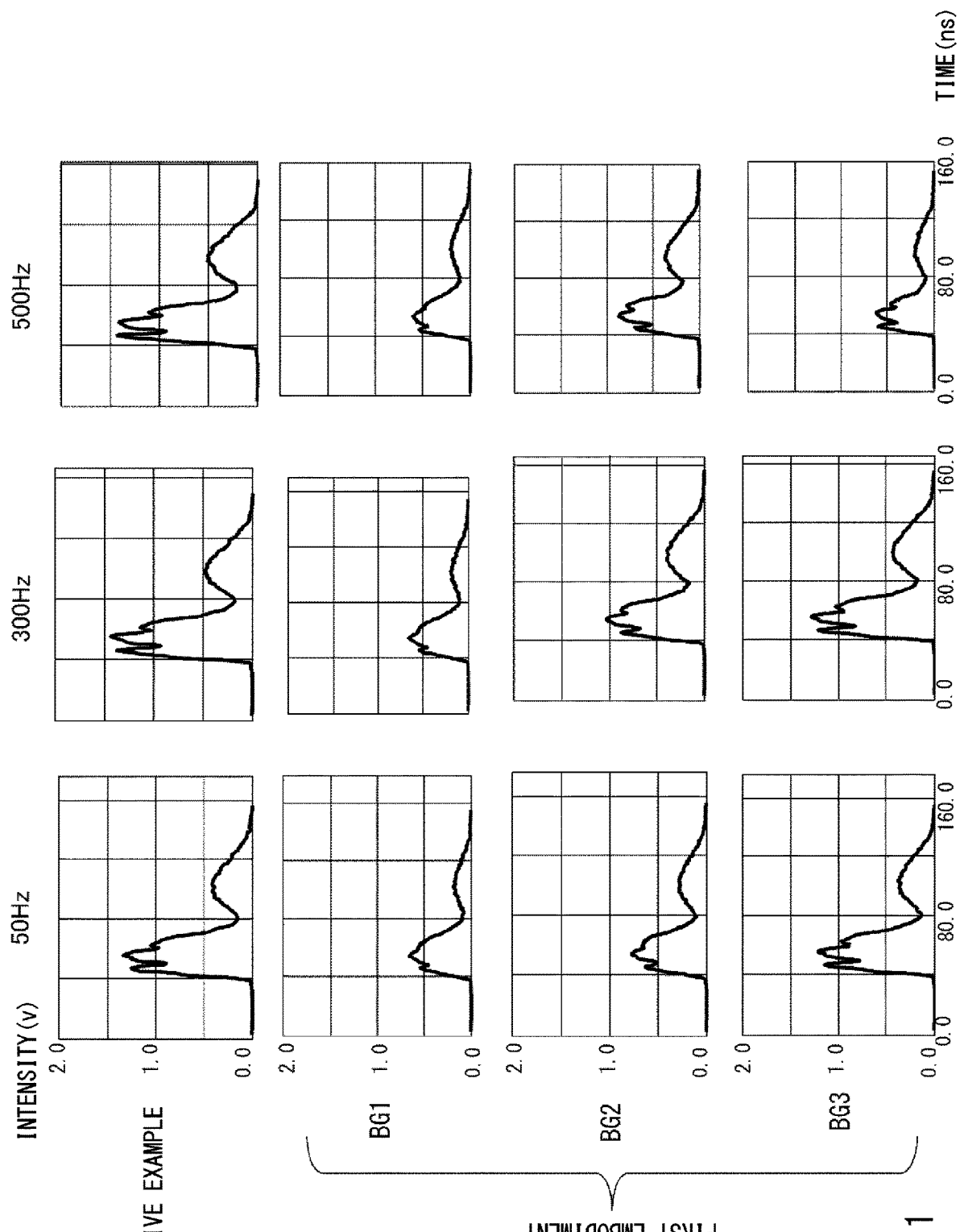
FIG. 11 is a graph showing a measurement result of the pulse waveform.
Figure 12:
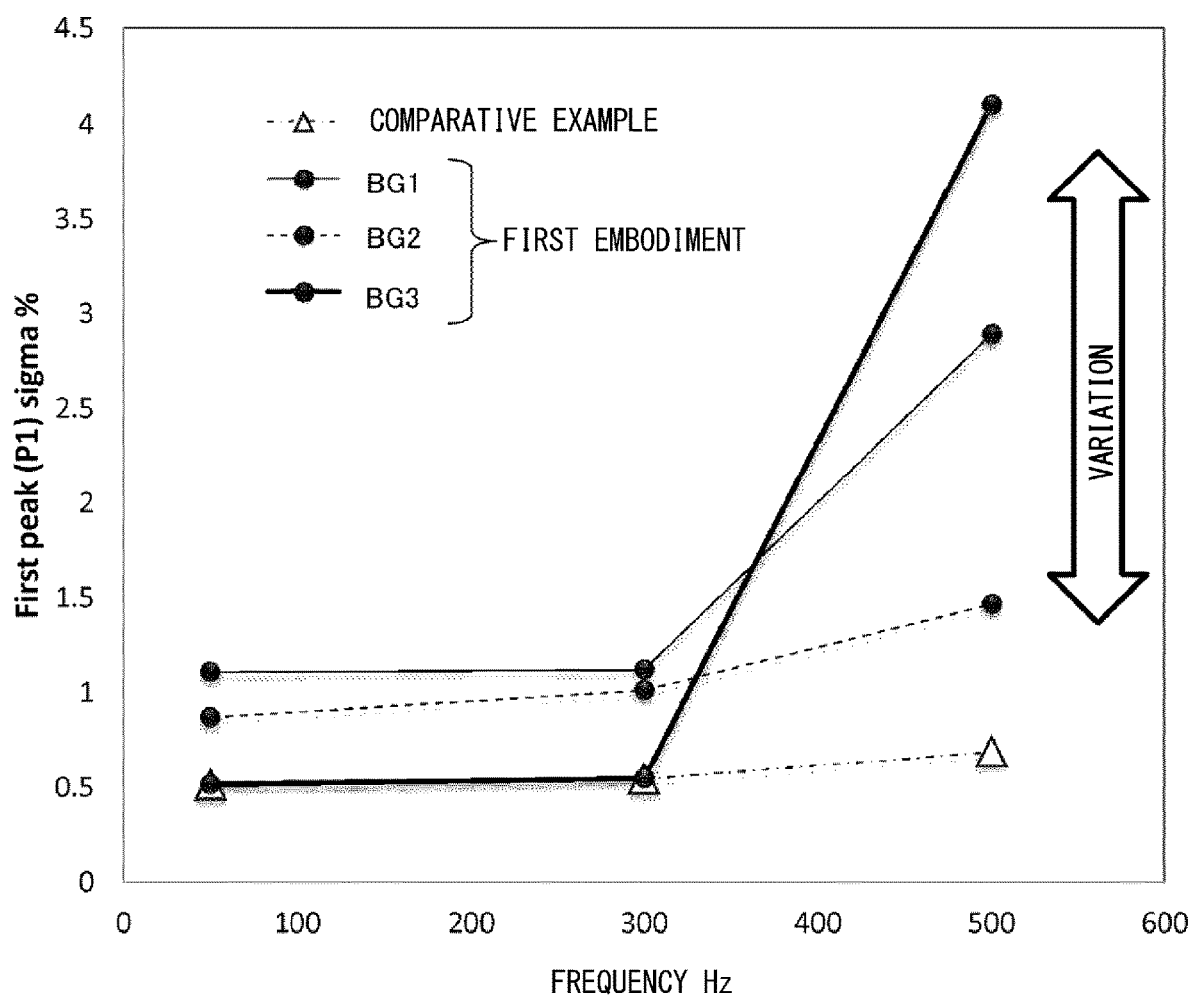
FIG. 12 is a graph showing an evaluation result of the pulse waveform.
Figure 13:
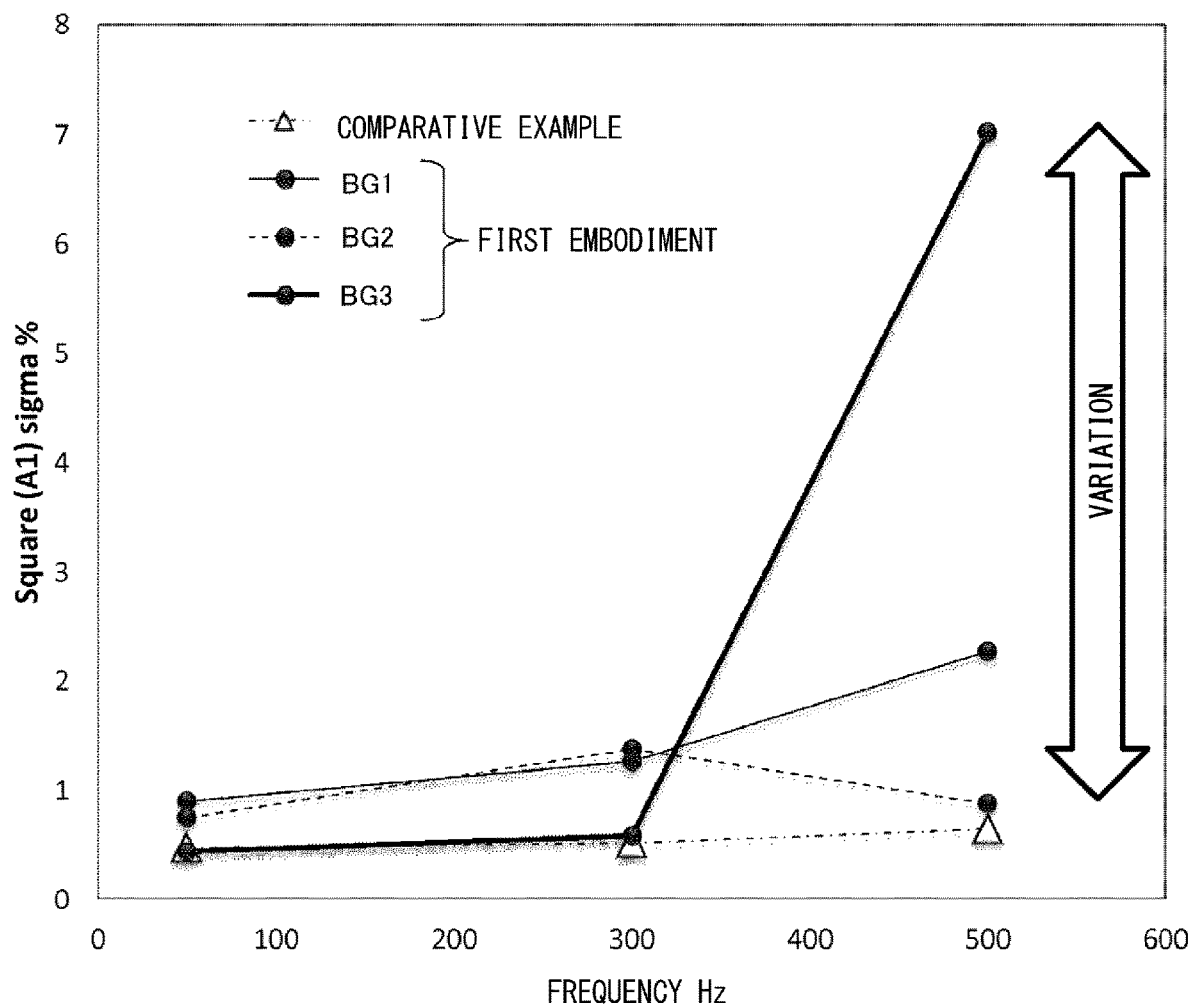
FIG. 13 is a graph showing an evaluation result of the pulse waveform.

A measurement result in a case where the pulse measuring instrument 900 of the comparative example is used and a measurement results in a case where the pulse measuring instrument 100 according to the present embodiment is used will be described with reference to FIGS. 11 to 13. FIGS. 11 to 13 show measurement results at pulse repetition frequencies of 50 Hz, 300 Hz, and 500 Hz. FIG. 11 shows pulse waveforms at each frequency, FIG. 12 shows the variance values ($\sigma$) of the first peak P1 of the pulse waveforms, and FIG. 13 shows the variance values ($\sigma$) of the area A1 (energy) of the pulse waveforms.

As shown in FIG. 11, the pulse waveforms measured by the pulse measuring instrument 900 of the comparative example have substantially ideal shapes (for example, as shown in FIG. 10) at any frequency of 50 Hz to 500 Hz. The comparative example can measure only a stable pulse waveform, and thus cannot grasp any spatial variation. On the other hand, the pulse waveforms measured by the pulse measuring instrument 100 according to the present embodiment clearly have different shapes in the beam groups BG1 to BG3 at any frequency. Therefore, the present embodiment can grasp the spatial variation by comparing the waveforms of the beam groups BG1 to BG3.

In FIG. 11, at the frequency of 50 Hz, the pulse waveform of the beam group BG3 is close to the ideal pulse waveform as in the comparative example. Comparing the pulse waveforms of the beam groups BG1 to BG3, the pulse waveforms of the beam groups BG1 and BG2 have first peaks P1 and second peaks P2 which are lower than those of the pulse waveform of the beam group BG3, and the shapes of the convex portions of the first peaks P1 in the beam groups BG1 and BG2 are blunt.

Further, at the frequency of 300 Hz, the pulse waveforms of the beam groups BG2 and BG3 are close to the ideal pulse waveform as in the comparative example. Comparing the pulse waveforms of the beam groups BG1 to BG3, the pulse waveform of the beam group BG1 has a first peak P1 and a second peak P2 which are lower than those of the pulse waveforms of the beam groups BG2 and BG3, and the shape of the first peak P1 of the beam group BG1 is blunt.

Further, at the frequency of 500 Hz, the pulse waveforms of the beam groups BG1 to BG3 are all different from the ideal pulse waveform. Comparing the pulse waveforms of the beam groups BG1 to BG3, the pulse waveforms of the beam groups BG1 and BG3 have first peaks P1 and second peaks P2 which are lower than those of the pulse waveform of the beam group BG2. Further, the shape of the convex portion of the first peak P1 in the pulse waveform of the beam group BG1 is blunter than those of the pulse waveforms of the beam groups BG2 and BG3.

As shown in FIG. 12, the variance value of the first peak P1 of the pulse waveform measured by the pulse measuring instrument 900 of the comparative example has a small change at the frequency of 50 Hz to 500 Hz. In the comparative example, since only the first peak P1 of the stable pulse waveform can be measured, it is not possible to grasp the spatial variation. On the other hand, in the measurement results by the pulse measuring instrument 100 according to the present embodiment, a difference occurs among the beam groups BG1 to BG3 at any frequency. Therefore, it is possible to grasp the spatial variation by comparing the first peaks P1 of the beam groups BG1 to BG3. In particular, at the frequency of 500 Hz, the difference between the beam group BG2 and the beam group BG3 is large, so that it can be determined that there is spatial variation in the present embodiment.

In FIG. 12, at 50 Hz, the value of the beam group B1 is equal to 1.1, the value of the beam group B2 is equal to 0.9, and the value of the beam group B3 is equal to 0.5. At 300 Hz, the value of the beam group B1 is equal to 1.1, the value of the beam group B2 is equal to 1.0, and the value of the beam group B3 is equal to 0.6. In other words, at 50 Hz and 300 Hz, there is a difference of about 0.5 between each of the beam groups B1 and B2 and the beam group B3. Further, at 500 Hz, the value of the beam group B1 is equal to 2.9, the value of the beam group B2 is equal to 1.5, and the value of the beam group B3 is equal to 4.1. In other words, at 500 Hz, there is a difference of 1.4 between the beam group B1 and the beam group B2, and also there is a difference of 2.6 between the beam group B2 and the beam group B3, so that the spatial variation is large.

As shown in FIG. 13, the variance value of the area A1 of the pulse waveforms measured by the pulse measuring instrument 900 of the comparative example has a small change over the frequency of 50 to 500 Hz. In the comparative example, as in the case of the first peak P1, only the area A1 of the stable pulse waveform can be measured, so that it is impossible to grasp the spatial variation. On the other hand, the measurement results obtained by the pulse measuring instrument 100 according to the present embodiment indicate that differences occurs among the beam groups BG1 to BG3 at any frequency. Therefore, it is possible to grasp the spatial variation by comparing the areas A1 of the beam groups BG1 to BG3. As in the case of the first peak P1 of FIG. 12, at the frequency of 500 Hz, the difference between the beam group BG2 and the beam group BG3 is large, so that it can be determined in the present embodiment that there is a spatial variation.

In FIG. 13, at 50 Hz, the value of the beam group B1 is equal to 0.9, the value of the beam group B2 is equal to 0.8, and the value of the beam group B3 is equal to 0.4. In other words, at 50 Hz, there is a difference of about 0.5 between each of the beam groups B1 and B2 and the beam group B3. Further, at 300 Hz, the value of the beam group B1 is equal to 1.3, the value of the beam group B2 is equal to 1.4, and the value of the beam group B3 is equal to 0.6. In other words, at 300 Hz, there is a difference of about 0.8 between each of the beam groups B1 and B2 and the beam group B3. Further, at 500 Hz, the value of the beam group B1 is equal to 2.3, the value of the beam group B2 is equal to 0.9, and the value of the beam group B3 is equal to 7.0. In other words, at 500 Hz, there is a difference of 1.4 between the beam group B1 and the beam group B2, and also there is a difference of 6.1 between the beam group B2 and the beam group B3, so that the spatial variation is large.

<Effect of First Embodiment>

As described above, in the present embodiment, the laser annealing device is configured to monitor the spatial variation of laser light with which an object to be processed is irradiated, and control the laser light according to the spatial variation. As a result, it is possible to detect the laser light that can correlate with the unevenness of a semiconductor film to be formed, and it is possible to suppress occurrence of unevenness in the semiconductor film. Further, the laser light to be irradiated can be optimized according to the individual difference of the laser oscillator. Further, in the pulse measuring instrument, the spatial variation can be reliably detected by detecting the intensity of each of a plurality of beam groups (or beams) included in the laser light. For example, by providing a plurality of photodetectors, the intensities of a plurality of beam groups can be detected at the same time.

Second Embodiment

Next, a second embodiment will be described. In the present embodiment, only the configuration of the pulse measuring instrument equipped in the ELA device is different from that in the first embodiment. The pulse measuring instrument according to the present embodiment measures beams selected through a slit by one photodetector. Others are the same as those in the first embodiment, and thus the description thereof will be omitted.

<Pulse Measuring Instrument of Second Embodiment>

Figure 14:
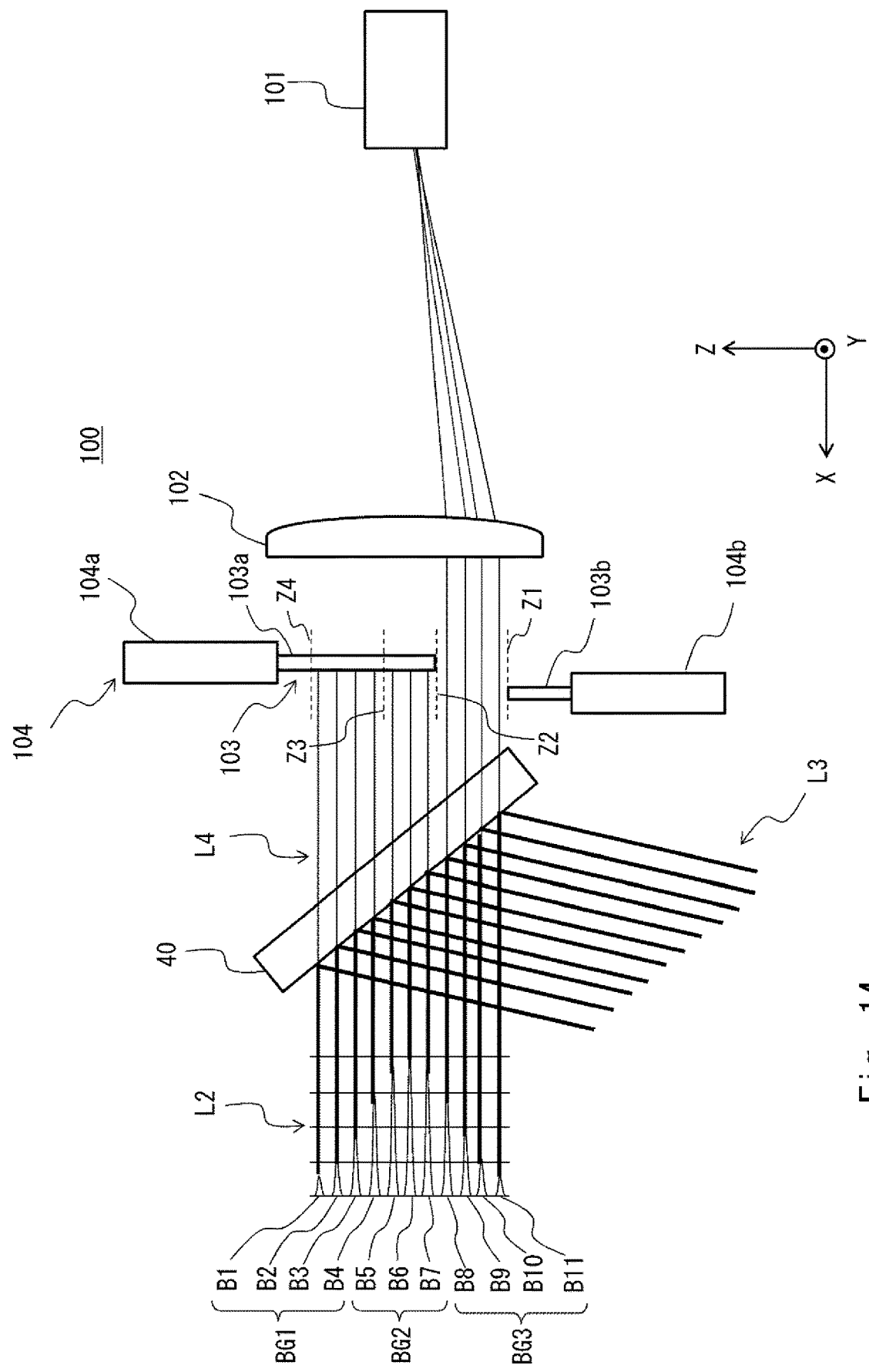
FIG. 14 is a side view showing a schematic configuration of a pulse measuring instrument according to a second embodiment.
Figure 15:
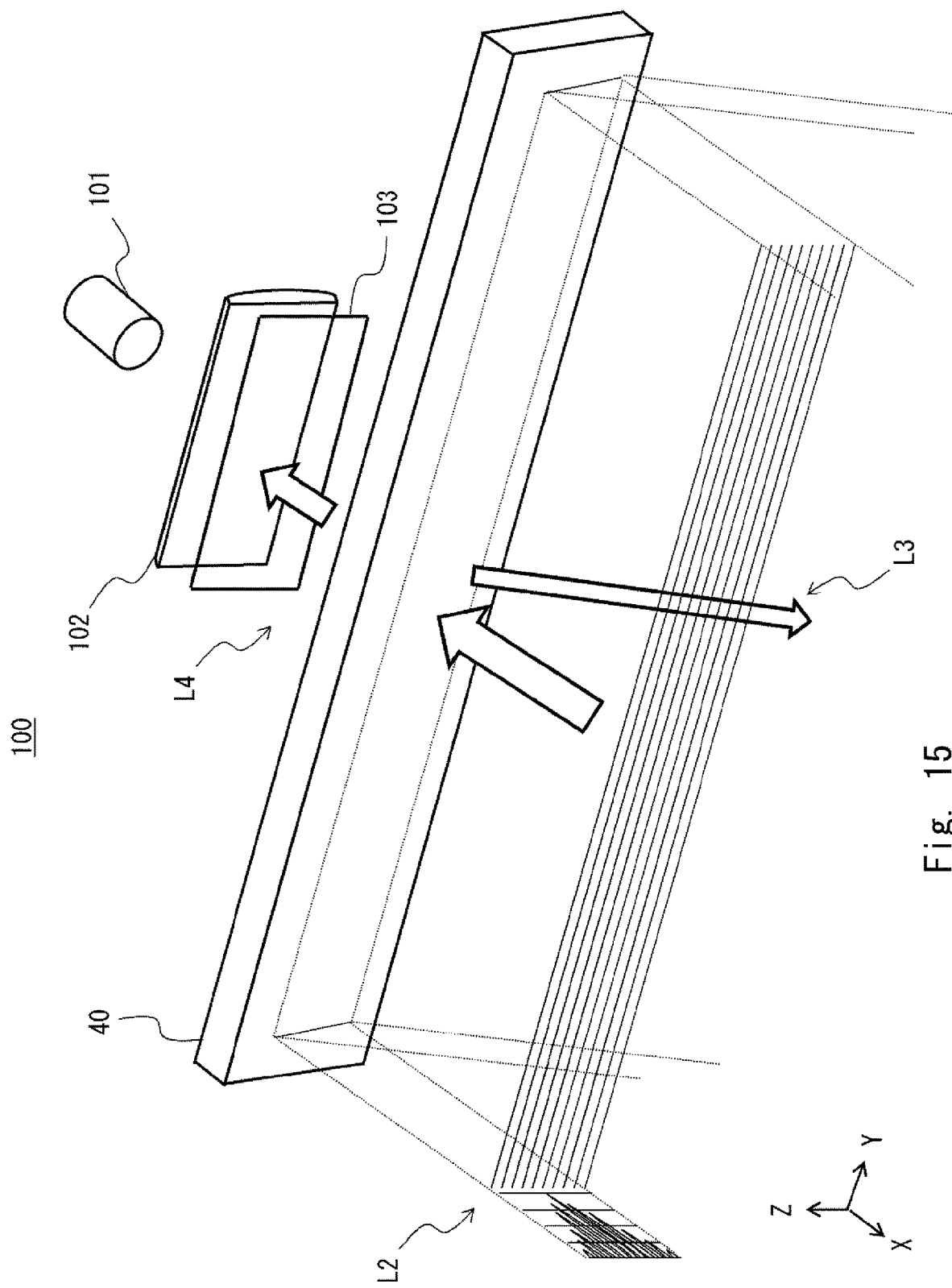
FIG. 15 is a perspective view showing the schematic configuration of the pulse measuring instrument according to the second embodiment.
Figure 16:
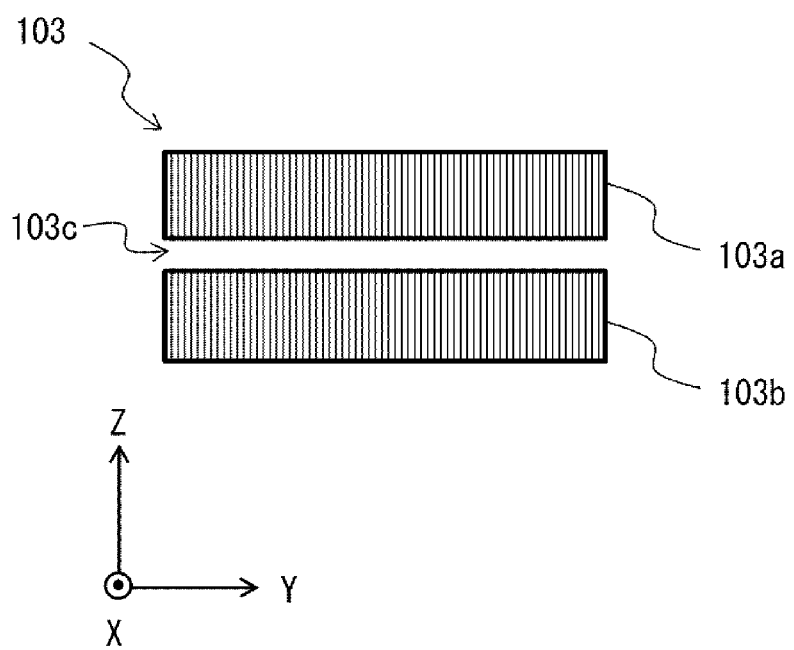
FIG. 16 is a front view showing a schematic configuration of a slit to be used in the pulse measuring instrument according to the second embodiment.
Figure 17:
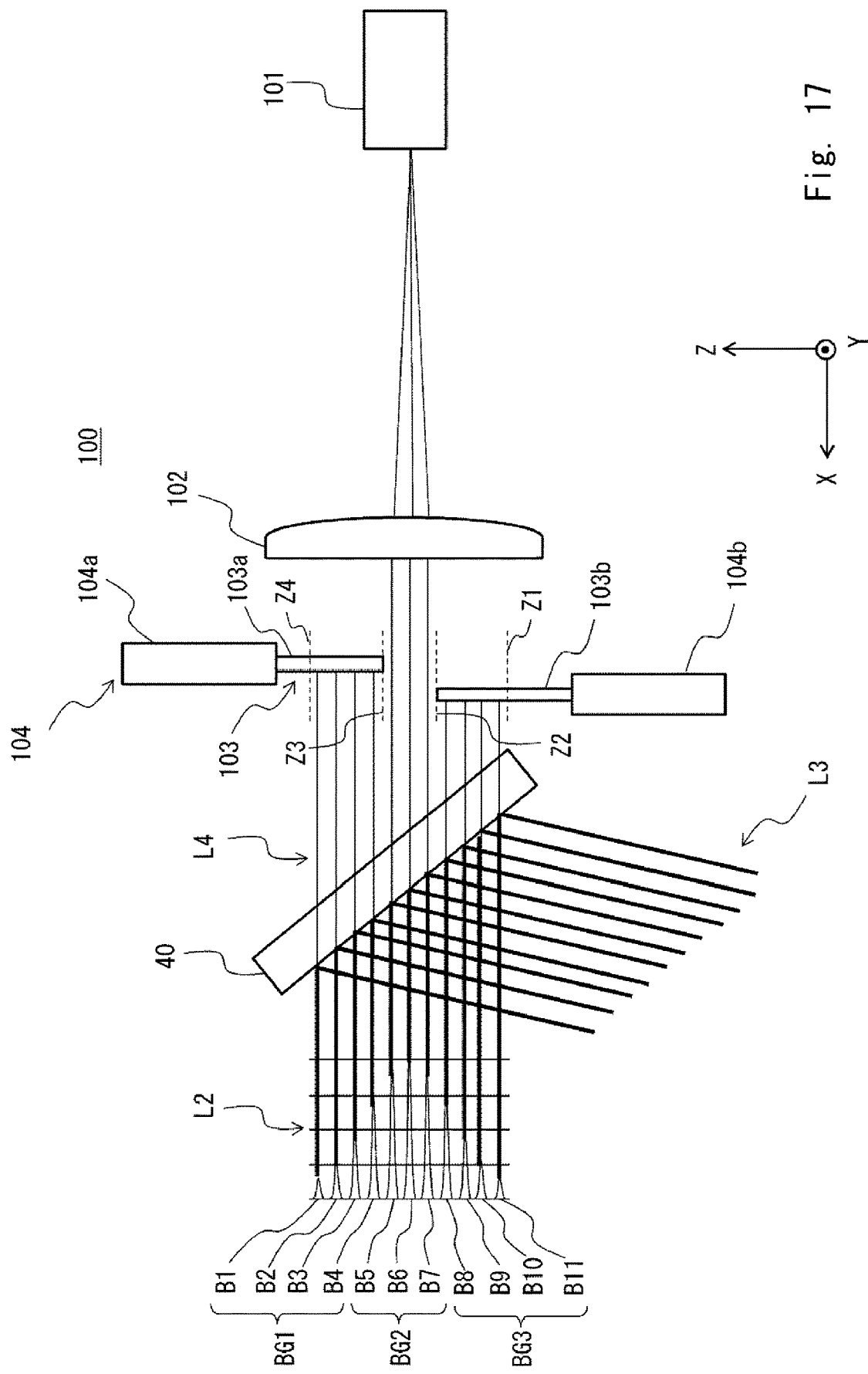
FIG. 17 is a side view showing the schematic configuration of the pulse measuring instrument according to the second embodiment.
Figure 18:
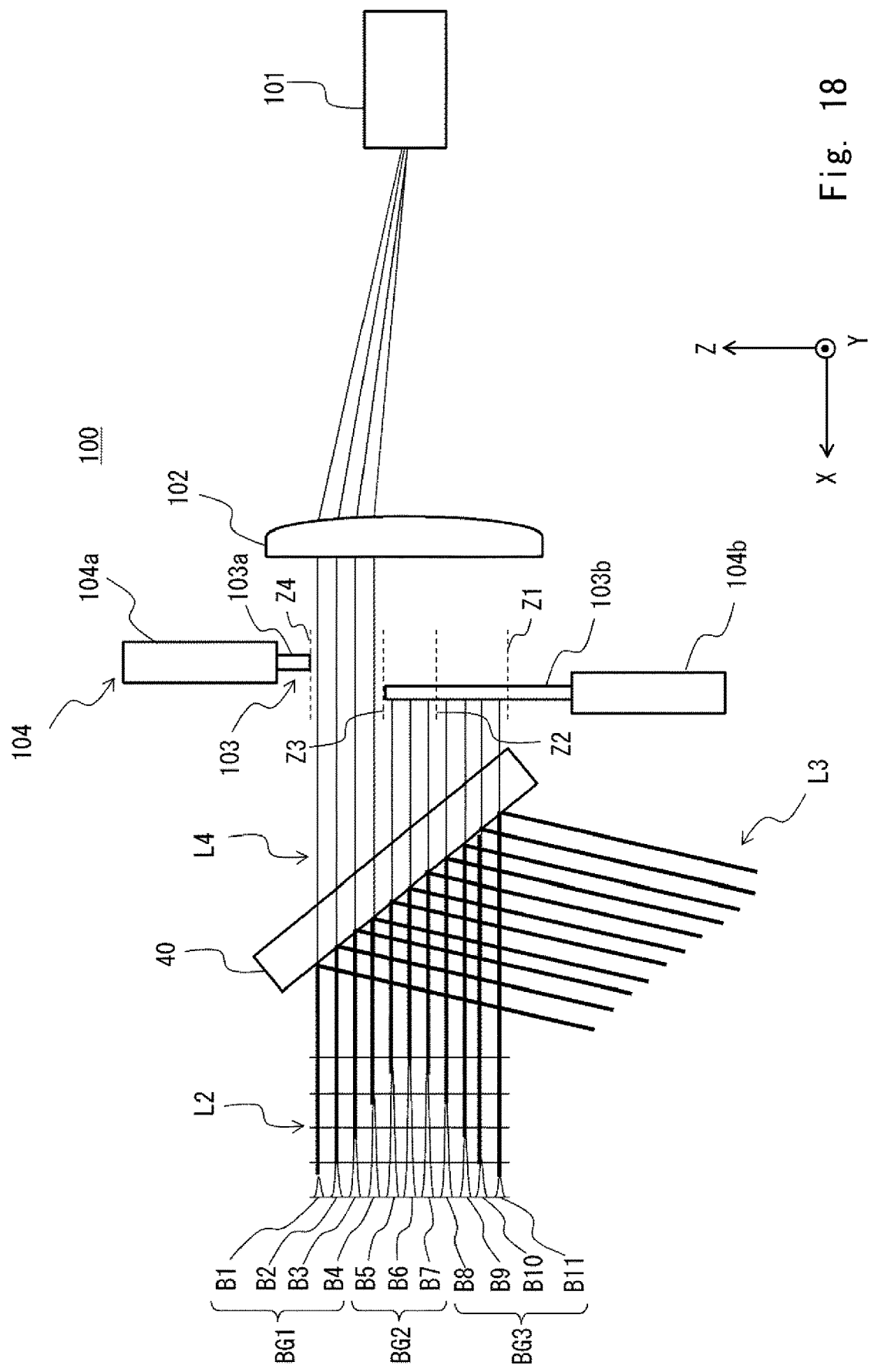
FIG. 18 is a side view showing the schematic configuration of the pulse measuring instrument according to the second embodiment.

The configuration of the pulse measuring instrument 100 according to the present embodiment will be described with reference to FIGS. 14 to 18. FIG. 14 is a side view showing a schematic configuration of the pulse measuring instrument 100, FIG. 15 is a perspective view showing the schematic configuration of the pulse measuring instrument 100, and FIG. 16 is a front view of a slit in the pulse measuring instrument 100. FIG. 17 and FIG. 18 are side views showing other states of the slit in the pulse measuring instrument 100.

As shown in FIG. 14 and FIG. 15, the pulse measuring instrument 100 according to the present embodiment includes a photodetector 101 and a condenser lens 102. The photodetector 101 and the condenser lens 102 have the same configuration as the comparative example of FIG. 5 and FIG. 6. In other words, the condenser lens 102 and the photodetector 101 are arranged in the vicinity of the center of the epi-illumination mirror 40, the condenser lens 102 converges the beams of the laser light L4, and the photodetector 101 detects the converged beams.

Further, the pulse measuring instrument 100 includes a slit 103 arranged between the epi-illumination mirror 40 and the condenser lens 102. The slit 103 is a beam selection unit for selecting and transmitting therethrough some of the beams of the laser light L4. In other words, the condenser lens 102 converges the beams of the laser light L4 selected by the slit 103.

As shown in FIG. 16, the slit 103 includes a rectangular light-shielding plate 103a and a light-shielding plate 103b which are arranged in parallel along the Y direction. The upper light-shielding plate 103a shields upper-side beams of the laser light L4, and the lower light-shielding plate 103b shields lower-side beams of the laser light L4, so that a part of the laser light L4 is transmitted from an opening portion 103c between the light-shielding plate 103a and the light-shielding plate 103b.

Further, as shown in FIG. 14, the slit 103 is a movable slit that can be driven in the Z direction by an air cylinder 104. For example, the air cylinder 104 is a two-stage type air cylinder, and any of the beam groups BG1 to BG3 is selected by driving the slit 103 so that the slit 103 stops at two stages (between positions Z1 and Z4 in FIG. 14). The air cylinder 104 includes a drive unit 104a for driving the light-shielding plate 103a, and a drive unit 104b for driving the light-shielding plate 103b. The light-shielding plate 103a and the light-shielding plate 103b are driven in conjunction with each other by the drive unit 104a and the drive unit 104b to move the opening portion 103c up and down in the Z direction, thereby selecting beams of the laser light L4 to be transmitted through the opening portion 103c. The drive unit 104b drives the upper end portion of the lower light-shielding plate 103b from the position Z1 to the position Z2, and further drives it from the position Z2 to the position Z3. The drive unit 104a drives the lower end portion of the upper light-shielding plate 103a from the position Z4 to the position Z3, and further drives it from the position Z3 to the position Z2. The drive of the drive unit 104a and the drive unit 104b is controlled, for example, from the monitoring device 60.

FIGS. 14, 17, and 18 show three states of the slit 103. FIG. 14 shows a state in which the slit 103 transmits therethrough the beam group BG3 including the lower four beams B8 to B11 out of the beams B1 to B11. In other words, the upper end portion of the lower-side light-shielding plate 103b is positioned at the position Z1 (first position) by the drive unit 104b, and the lower end portion of the upper-side light-shielding plate 103a is positioned at the position Z2 (second position) by the drive unit 104a, whereby the beams B8 to B11 are transmitted through the opening portion 103c between the position Z1 and the position Z2.

FIG. 17 shows a state in which the slit 103 transmits therethrough the beam group BG2 including the three central beams B5 to B7 out of the beams B1 to B11. In other words, the upper end portion of the lower-side light-shielding plate 103b is positioned at the position Z2 (second position) by the drive unit 104b, and the lower end portion of the upper-side light-shielding plate 103a is positioned at the position Z3 (third position) by the drive unit 104a, whereby the beams B5 to B7 are transmitted through the opening portion 103c between the positions Z2 and the position Z3.

FIG. 18 shows a state in which the slit 103 transmits therethrough the beam group BG1 including the upper four beams B1 to B4 out of the beams B1 to B11. In other words, the upper end portion of the lower-side light-shielding plate 103b is positioned at the position Z3 (third position) by the drive unit 104b, and the lower end portion of the upper-side light-shielding plate 103a is positioned at the position Z4 (fourth position) by the drive unit 104a, whereby the beams B1 to B4 are transmitted through the opening portion 103c between the position Z3 and the position Z4.

The position of the opening portion 103c of the slit 103 may be set in advance or may be automatically detected. For example, the position of one of the light-shielding plates 103a and the light-shielding plate 103b is fixed, and the intensity of the transmitted light is detected while gradually moving the position of the other light-shielding plate in the Z direction. In this case, the cumulative value of the light intensity changes stepwise according to the beams, so that the position of a selected beam in the Z direction can be detected from the position where the light intensity changes greatly.

<Pulse Measuring Instrument of Modification>

Figure 19:
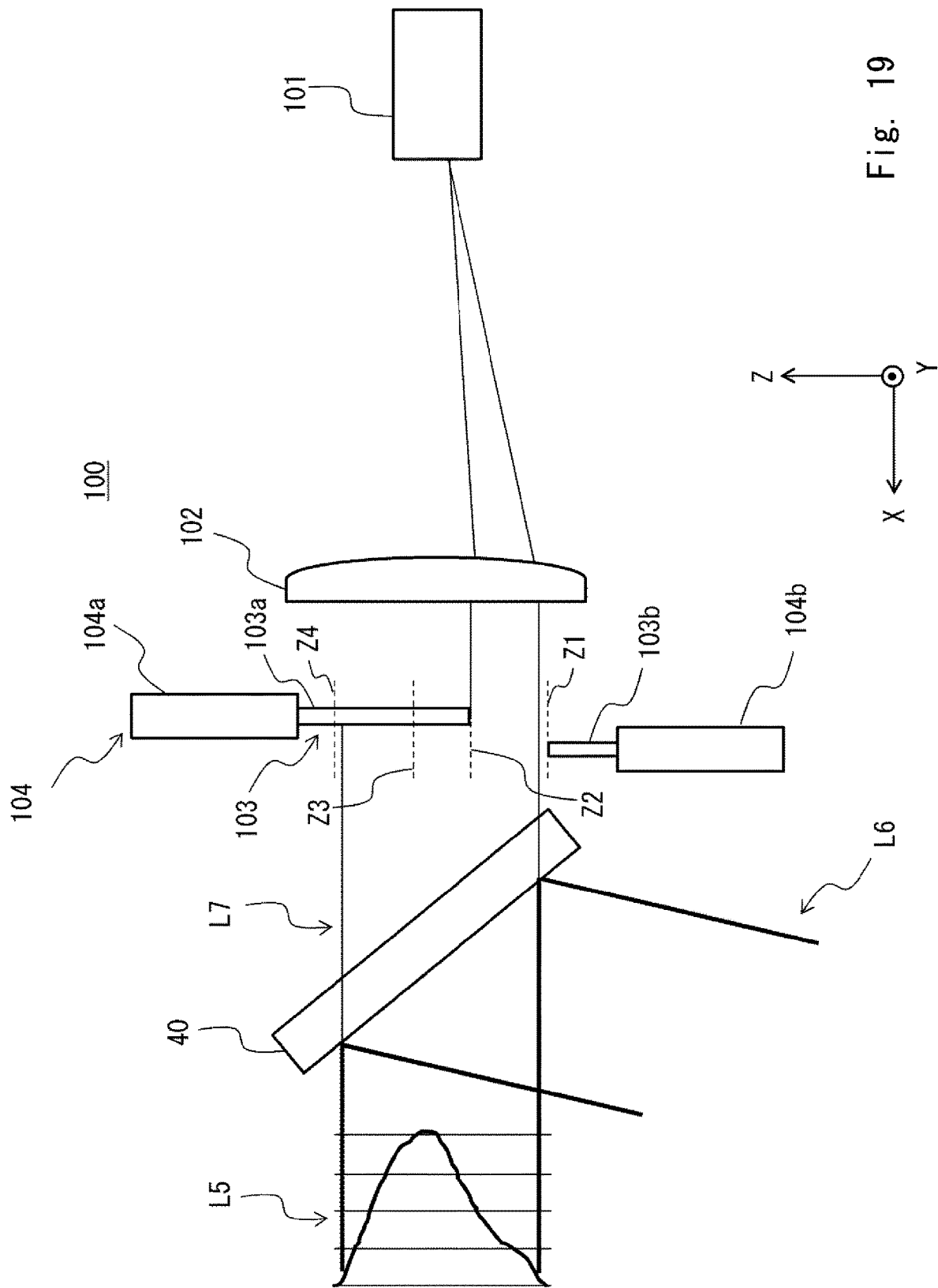
FIG. 19 is a side view showing a schematic configuration of a pulse measuring instrument according to a modification example.

In the present embodiment, beams obtained by dividing laser light may be detected by a photodetector as in the case of the first embodiment, or undivided (or before-divided) laser light may be detected through the slit. FIG. 19 shows the configuration of a pulse measuring instrument 100 of a modification that measures undivided laser light (Raw beam). As shown in FIG. 19, the pulse measuring instrument 100 of the modification has the same configuration as the pulse measuring instrument 100 of the present embodiment shown in FIG. 14.

In this example, undivided laser light L5 is reflected by the epi-illumination mirror 40 to obtain laser light L6, and a part of the light is transmitted therethrough to obtain laser light L7. As in the case of FIG. 14, the slit 103 selects and transmits therethrough a part of the laser light L7, the condenser lens 102 converges a part of the laser light L7 selected by the slit 103, and the photodetector 101 detects the converged light.

<Effect of Second Embodiment>

As described above, in the present embodiment, the pulse measuring instrument of the ELA device includes a slit for selecting light to be measured. As a result, as in the first embodiment, the spatial variation of the laser light can be monitored. For example, by using a movable slit, light to be measured can be arbitrarily selected, so that light in a plurality of spaces can be detected by one detector. Even when the number of photodetectors to be arranged is limited, it is possible to reliably monitor the spatial variation of the laser light.

Third Embodiment

Next, a third embodiment will be described. In the present embodiment, only the configuration of the pulse measuring instrument equipped in the ELA device is different from those in the first and second embodiments. The pulse measuring instrument according to the present embodiment measures beams selected by the slit by a plurality of photodetectors. Others are the same as those of the first and second embodiments, and thus the description thereof will be omitted.

<Pulse Measuring Instrument of Third Embodiment>

Figure 20:
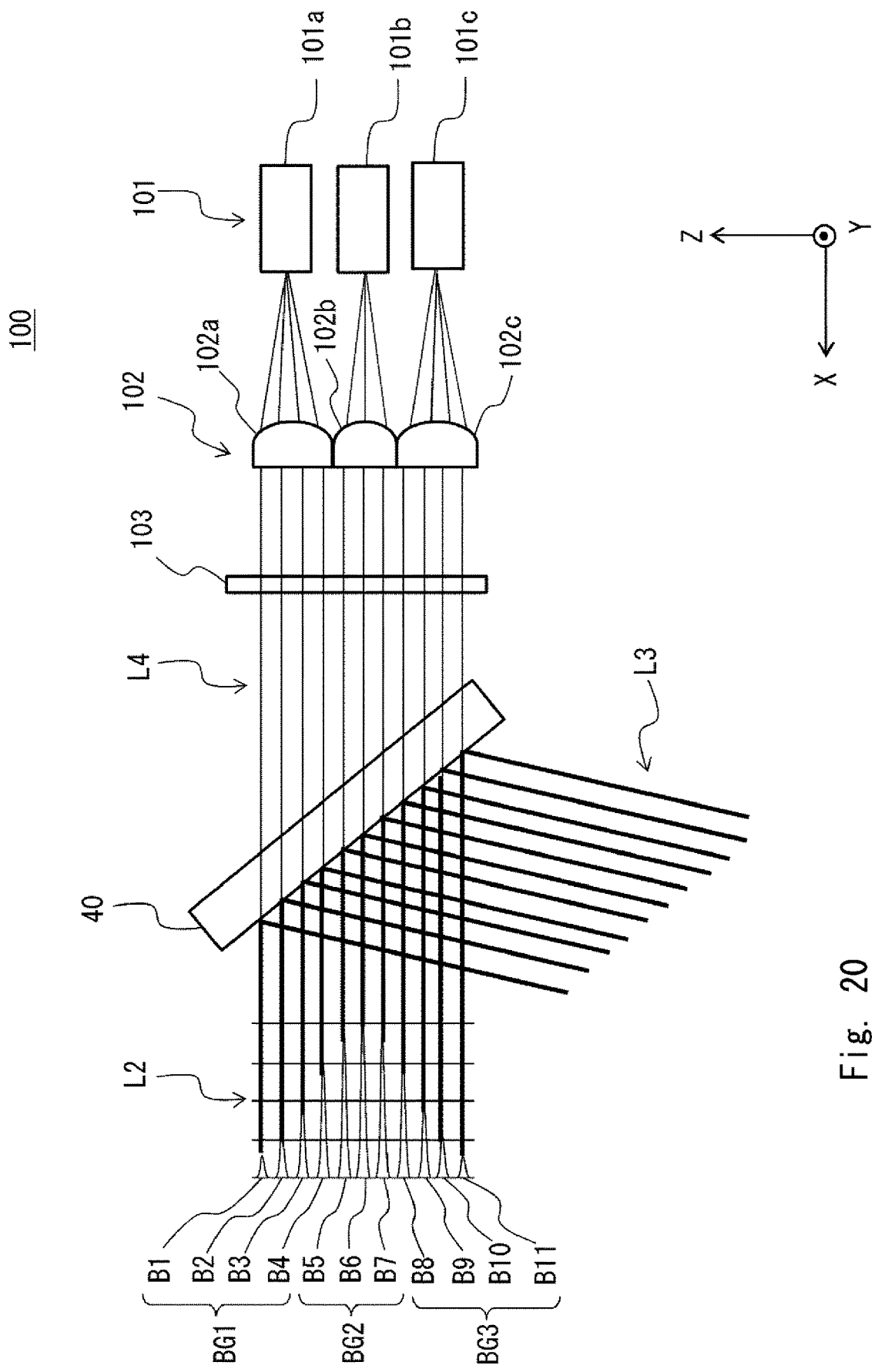
FIG. 20 is a side view showing a schematic configuration of a pulse measuring instrument according to a third embodiment.

The configuration of the pulse measuring instrument 100 according to the present embodiment will be described with reference to FIGS. 20 to 22. FIG. 20 is a side view showing a schematic configuration of the pulse measuring instrument 100, FIG. 21 is a perspective view showing the schematic configuration of the pulse measuring instrument 100, and FIG. 22 is a front view of the slit in the pulse measuring instrument 100.

Figure 21:
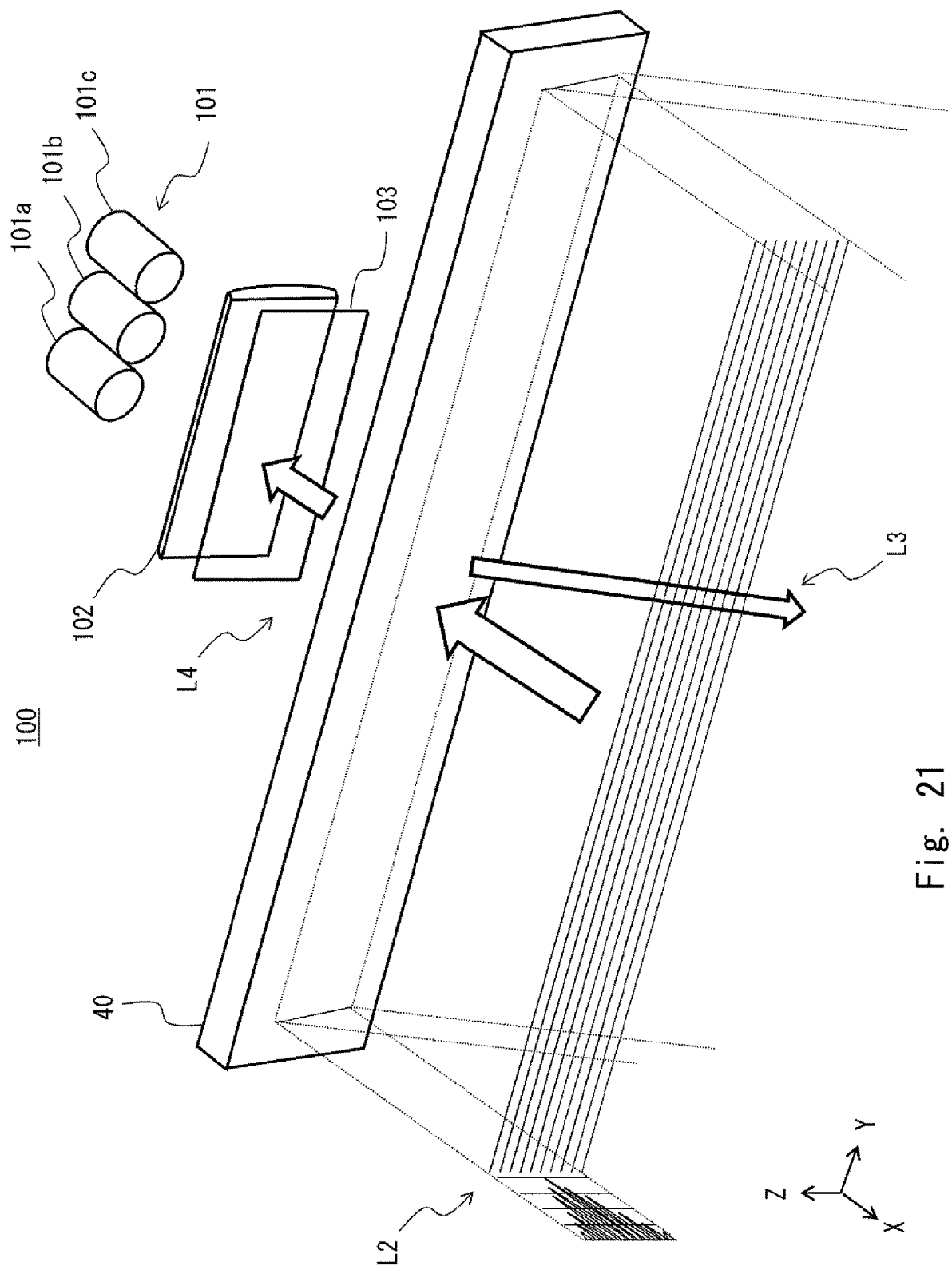
FIG. 21 is a perspective view showing the schematic configuration of the pulse measuring instrument according to the third embodiment.
Figure 22:
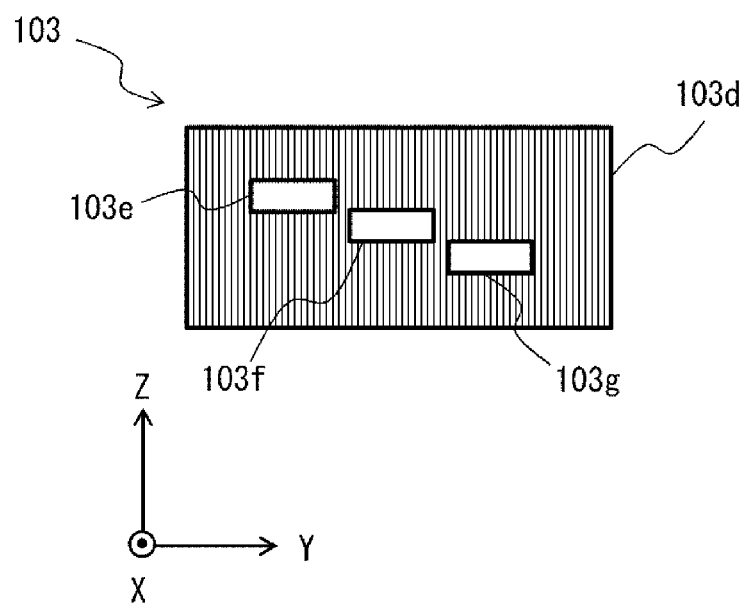
FIG. 22 is a front view showing a schematic configuration of a slit to be used in the pulse measuring instrument according to the third embodiment.

As shown in FIG. 20 and FIG. 21, the pulse measuring instrument 100 according to the present embodiment includes a plurality of photodetectors 101 and a plurality of condenser lenses 102. The pulse measuring instrument 100 includes, for example, three photodetectors 101a to 101c and three condenser lenses 102a to 102c as in the case of FIG. 7 and FIG. 8 of the first embodiment. In other words, the beams B1 to B4 of the beam group BG1 are detected by the photodetector 101a via the condenser lens 102a. Likewise, the beams B5 to B7 of the beam group BG2 are detected by the photodetector 101b via the condenser lens 102b, and the beams B8 to B11 of the beam group BG3 are detected by the photodetector 101c via the condenser lens 102c.

Further, the pulse measuring instrument 100 includes a slit 103 arranged between the epi-illumination mirror 40 and the condenser lens 102 as in the second embodiment. As shown in FIG. 22, the slit 103 is a rectangular light-shielding plate 103d, and the light-shielding plate 103d has rectangular opening portions 103e to 103g. The opening portions 103e to 103g are formed to be diagonally arranged in the Z direction so as to correspond to the positions of the beams of the transmitted laser light L4. The respective beams transmitted through the opening portions 103e to 103g are converged by the condenser lenses 102a to 102c, respectively. Photodetectors 101a to 101c are arranged at positions facing the opening portions 103e to 103g, respectively. For example, the opening portions 103e to 103g are formed at positions where the opening portions 103e to 103g do not overlap one another in the Z direction in the light-shielding plate 103d, whereby any beam can be selected and transmitted through each opening. In this example, the opening portion 103e is formed on an upper left side in the light-shielding plate 103d when viewed from the incident surface side of the light-shielding plate 103d, and transmits the beam group BG1 including the beams B1 to B4 therethrough. The opening portion 103f is formed in the center of the light-shielding plate 103d when viewed from the incident surface side of the light-shielding plate 103d, and transmits the beam group BG2 including the beams B5 to B7 therethrough. The opening portion 103g is formed on a lower right side in the light-shielding plate 103d when viewed from the incident surface side of the light-shielding plate 103d, and transmits the beam group BG3 including the beams B8 to B11 therethrough. The opening portion 103e may be formed on the upper right side in the light-shielding plate 103d, the opening portion 103f may be formed in the center of the light-shielding plate 103d, and the opening portion 103g may be formed on the lower left side in the light-shielding plate 103d.

<Effect of Third Embodiment>

As described above, in the present embodiment, the pulse measuring instrument of the ELA device includes a slit for selecting light to be measured as in the case of the second embodiment. As a result, it is possible to monitor the spatial variation of laser light as in the first and second embodiments. For example, a fixed type slit is provided with opening portions corresponding to a plurality of light to be measured respectively, whereby it is possible to detect light in a plurality of spaces without providing any drive mechanism for driving the slit. Further, by providing a plurality of photodetectors as in the first embodiment, it is possible to simultaneously detect a plurality of light of laser light. The pulse measuring instrument of the present embodiment can also measure undivided laser light as in FIG. 19 of the modification.

Another Embodiment

Next, a method of manufacturing a semiconductor device by using the ELA device according to the above embodiments will be described as another embodiment. In the following method for manufacturing a semiconductor device, annealing processing using the ELA device according to the first to third embodiments is performed in the step of crystallizing an amorphous semiconductor film.

The semiconductor device is a semiconductor device including a TFT (Thin Film Transistor), and in this case, it is possible to irradiate an amorphous silicon film with laser light to crystallize the amorphous silicon film, thereby forming a polysilicon film. The polysilicon film is used as a semiconductor layer having a source region, a channel region, and a drain region of the TFT.

<Method for Manufacturing Semiconductor Device According to Another Embodiment>

FIGS. 23 to 27 are cross-sectional views showing an example of the method for manufacturing a semiconductor device. The ELA device according to the embodiment described above is suitable for manufacturing a TFT array substrate. Hereinafter, a method for manufacturing a semiconductor device having TFT will be described.

Figure 23:
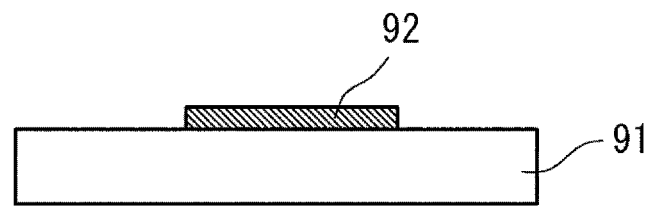
FIG. 23 is a step sectional view showing a method of manufacturing a semiconductor device according to another embodiment.
Figure 24:
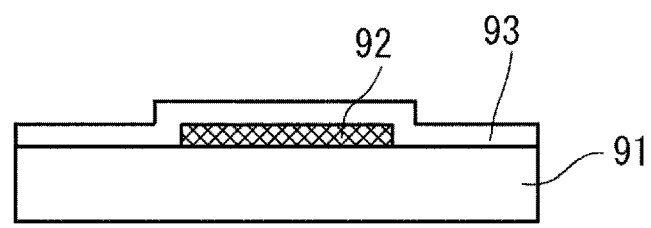
FIG. 24 is a process sectional view showing the method of manufacturing a semiconductor device according to the other embodiment.
Figure 25:
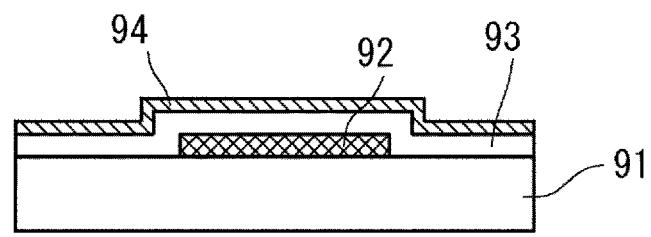
FIG. 25 is a process sectional view showing the method of manufacturing a semiconductor device according to the other embodiment.

First, as shown in FIG. 23, a gate electrode 92 is formed over a glass substrate 91 (corresponding to the above-described substrate 200). For example, a metal thin film including aluminum or the like may be used as the gate electrode 92. Next, as shown in FIG. 24, a gate insulating film 93 is formed over the gate electrode 92. The gate insulating film 93 is formed so as to cover the gate electrode 92. Thereafter, as shown in FIG. 25, an amorphous silicon film 94 (corresponding to the above-mentioned amorphous silicon film 201a) is formed over the gate insulating film 93. The amorphous silicon film 94 is arranged so as to overlap the gate electrode 92 via the gate insulating film 93.

The gate insulating film 93 is a silicon nitride film ($SiN_x$), a silicon oxide film ($SiO_2$ film), a lamination film thereof, or the like. Specifically, the gate insulating film 93 and the amorphous silicon film 94 are continuously formed by a CVD (Chemical Vapor Deposition) method. The glass substrate 91 with the amorphous silicon film 94 serves as the semiconductor film in the laser processing device.

Figure 26:
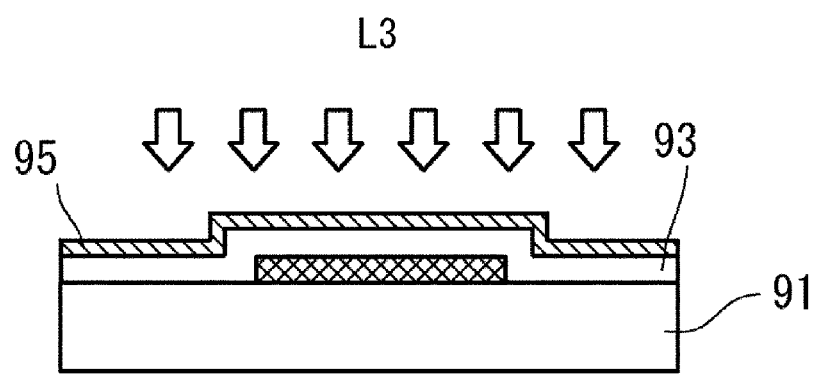
FIG. 26 is a process sectional view showing the method of manufacturing a semiconductor device according to the other embodiment.

Thereafter, as shown in FIG. 26, the amorphous silicon film 94 is irradiated with laser light L3 by using the ELA device described above to crystallize the amorphous silicon film 94, thereby forming a polysilicon film 95 (corresponding to the above-mentioned polysilicon film 201b). As a result, the polysilicon film 95 in which silicon has been crystallized is formed over the gate insulating film 93. Before this step, the pulse waveform monitoring method using the ELA device described above is performed, so that it is possible to suppress occurrence of unevenness in the polysilicon film 95.

Figure 27:
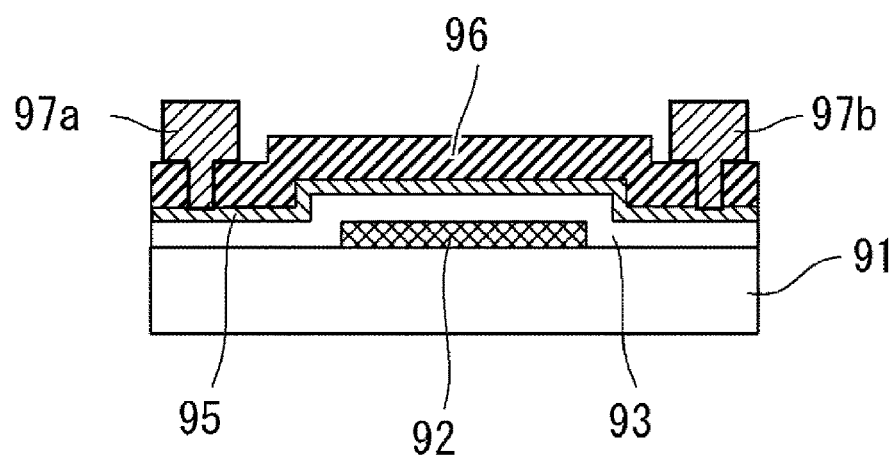
FIG. 27 is a process sectional view showing the method of manufacturing a semiconductor device according to the other embodiment.

Thereafter, as shown in FIG. 27, an interlayer insulating film 96, a source electrode 97a, and a drain electrode 97b are formed over the polysilicon film 95. The interlayer insulating film 96, the source electrode 97a, and the drain electrode 97b can be formed by using a general photolithography method or a film forming method. The subsequent manufacturing steps are omitted because they differs depending on a device to be finally manufactured.

By using the method for manufacturing a semiconductor device described above, it is possible to manufacture a semiconductor device having TFT including a polycrystalline semiconductor film. Such semiconductor devices are suitable for controlling high-definition displays such as Organic ElectroLuminescence displays (organic light-emitting diode displays). By suppressing unevenness of the polysilicon film as described above, it is possible to manufacture display devices having excellent display characteristics with high productivity.

The present invention is not limited to the above embodiments, and can be appropriately modified without departing from the gist of the invention. For example, in the laser annealing device, the present invention is not limited to the example in which an amorphous silicon film is irradiated with laser beam to form a polysilicon film, and an amorphous silicon film may be irradiated with laser light to form a microcrystal silicon film. Further, an amorphous film other than the silicon film may be irradiated with laser light to form a crystallized film.

REFERENCE SIGNS LIST

1 ELA DEVICE
2 ANNEALING OPTICAL SYSTEM
10 LASER OSCILLATOR
11, 12 RESONATOR MIRROR
20 INPUT OPTICAL SYSTEM
21, 22 REFLECTION MIRROR
30 BEAM SHAPER
40 EPI-ILLUMINATION MIRROR
50 LASER IRRADIATION CHAMBER
51 STAGE
52 BASE
60 MONITORING DEVICE
70 CONTROL DEVICE
91 GLASS SUBSTRATE
92 GATE ELECTRODE
93 GATE INSULATING FILM
94 AMORPHOUS SILICON FILM
95 POLYSILICON FILM
96 INTERLAYER INSULATING FILM
97a SOURCE ELECTRODE
97b DRAIN ELECTRODE
100 PULSE MEASURING INSTRUMENT
101, 101a, 101b, 101c PHOTODETECTOR
102, 102a, 102b, 102c CONDENSER LENS
103 SLIT
103a, 103b, 103d LIGHT-SHIELDING PLATE
103c, 103e, 103f, 103g OPENING PORTION
104 AIR CYLINDER
104a, 104b DRIVE UNIT
200 SUBSTRATE
201 SILICON FILM
201a AMORPHOUS SILICON FILM
201b POLYSILICON FILM

The invention claimed is:

1. A laser processing device comprising:
a laser generation device configured to generate laser light to be applied to an object to be processed;
a photodetection device configured to detect a first partial light and a second partial light contained in the laser light; and
a monitoring unit configured to generate a waveform for the first partial light and a waveform for the second partial light, and compare an area of the waveform of the first partial light with an area of the waveform of the second partial light.

2. The laser processing device according to claim 1, wherein the laser light is configured to crystallize an amorphous film over a substrate to form a crystallized film.

3. The laser processing device according to claim 1, wherein the laser light is gas laser light.

4. The laser processing device according to claim 3, wherein the laser light is excimer laser light.

5. The laser processing device according to claim 1, further comprising an optical system configured to divide the laser light into a plurality of divisional beams,
wherein the photodetection device detects a first divisional beam and a second divisional beam included in the plurality of divisional beams as the first partial light and the second partial light.

6. The laser processing device according to claim 5, wherein the photodetection device detects a first divisional beam group and a second divisional beam group included in the plurality of divisional beams as the first partial light and the second partial light.

7. The laser processing device according to claim 1, wherein the photodetection device comprises:
a first photodetector configured to detect the first partial light; and
a second photodetector configured to detect the second partial light.

8. The laser processing device according to claim 7, wherein the photodetection device comprises:
a first condenser lens configured to converge the first partial light onto a first photodetector; and
a second condenser lens configured to converge the second partial light onto a second photodetector.

9. The laser processing device according to claim 7, wherein the photodetection device further comprises a slit configured to transmit the first partial light and the second partial light therethrough.

10. The laser processing device according to claim 1, wherein the photodetection device comprises:
a slit configured to transmit the first partial light or the second partial light therethrough; and
a photodetector configured to detect the transmitted first partial light or second partial light.

11. The laser processing device according to claim 10, wherein the slit is a movable slit that can be driven so as to transmit the first partial light or the second partial light therethrough.

12. The laser processing device according to claim 10, wherein the photodetection device further comprises a condenser lens configured to converge the transmitted first partial light or second partial light onto the photodetector.

13. The laser processing device according to claim 1, wherein the monitoring unit determines values indicating variances between the areas of the waveforms.

14. The laser processing device according to claim 13, wherein each of the areas represents an energy in each respective waveforms.

15. The laser processing device according to claim 13, wherein the monitoring unit determines a difference between the variance values.

16. The laser processing device according to claim 15, further comprising a control unit configured to control a condition for generating the laser light in the laser generation device based on the differences in the variance values.

17. The laser processing device according to claim 13, further comprising a control unit configured to control a condition for generating the laser light in the laser generation device based on the variance values.

18. The laser processing device according to claim 1, further comprising a control unit configured to control a condition for generating the laser light in the laser generation device based on the comparison result.

19. The laser processing device according to claim 18, wherein the control unit controls an angle of a resonator mirror equipped in the laser generation device.

20. A laser light monitoring method comprising:
   (A) generating laser light to be applied to an object to be processed;
   (B) detecting first partial light and second partial light contained in the laser light; and
   (C) generating a waveform for the first partial light and a waveform for the second partial light, and comparing an area of the waveform of the first partial light with an area of the waveform of the second partial light.

* * * * *